(12) United States Patent
Ro et al.

(10) Patent No.: US 10,615,354 B2
(45) Date of Patent: Apr. 7, 2020

(54) ORGANIC PHOTOELECTRONIC DEVICE AND IMAGE SENSOR

(71) Applicant: Samsung Electronics Co., Ltd., Suwon-si, Gyeonggi-do (KR)

(72) Inventors: Takkyun Ro, Hwaseong-si (KR); Kyung Bae Park, Hwaseong-si (KR); Ryuichi Satoh, Numazu-si (JP); Yong Wan Jin, Seoul (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/258,952

(22) Filed: Jan. 28, 2019

(65) Prior Publication Data

US 2019/0157594 A1 May 23, 2019

Related U.S. Application Data

(62) Division of application No. 15/362,964, filed on Nov. 29, 2016, now Pat. No. 10,236,461.

(30) Foreign Application Priority Data

May 20, 2016 (KR) .......................... 10-2016-0062362

(51) Int. Cl.
*H01L 29/08* (2006.01)
*H01L 51/44* (2006.01)
(Continued)

(52) U.S. Cl.
CPC .......... *H01L 51/447* (2013.01); *H01L 27/307* (2013.01); *H01L 51/006* (2013.01);
(Continued)

(58) Field of Classification Search
CPC ............... H01L 51/447; H01L 51/5056; H01L 51/0058; H01L 51/0061; H01L 51/0067
See application file for complete search history.

(56) References Cited

U.S. PATENT DOCUMENTS 6,087,258 A 7/2000 Simpson et al.
6,300,612 B1 10/2001 Yu
(Continued)

FOREIGN PATENT DOCUMENTS

CN 104230953 A 12/2014
DE 102004014046 A1 9/2004
(Continued)

OTHER PUBLICATIONS

European Office Action for corresponding U.S. Appl. No. 15/362,964 dated Nov. 29, 2016.
(Continued)

*Primary Examiner* — Phuc T Dang
(74) *Attorney, Agent, or Firm* — Harness, Dickey & Pierce, P.L.C.

(57) ABSTRACT

An organic photoelectronic device may include a photoelectronic conversion layer between a first electrode and a second electrode and a buffer layer on the photoelectronic conversion layer. The photoelectronic conversion layer may be between a first electrode and a second electrode, and the buffer layer may be between the first electrode and the photoelectronic conversion layer. The photoelectronic conversion layer may include at least a first light absorbing material and a second light absorbing material configured to provide a p-n junction. The buffer layer may include the first light absorbing material and a non-absorbing material associated with a visible wavelength spectrum of light. The non-absorbing material may have a HOMO energy level of about 5.4 eV to about 5.8 eV. The non-absorbing material
(Continued)

may have an energy bandgap of greater than or equal to about 2.8 eV.

9 Claims, 14 Drawing Sheets

(51) Int. Cl.
    *H01L 51/42*     (2006.01)
    *H01L 51/50*     (2006.01)
    *H01L 27/30*     (2006.01)
    *H01L 51/00*     (2006.01)

(52) U.S. Cl.
    CPC ...... *H01L 51/0058* (2013.01); *H01L 51/0061* (2013.01); *H01L 51/0067* (2013.01); *H01L 51/0072* (2013.01); *H01L 51/4253* (2013.01); *H01L 51/4273* (2013.01); *H01L 51/5056* (2013.01); *H01L 51/0052* (2013.01); *H01L 51/0053* (2013.01); *H01L 51/0062* (2013.01); *H01L 51/442* (2013.01); *H01L 51/448* (2013.01); *Y02E 10/549* (2013.01)

(56) References Cited

U.S. PATENT DOCUMENTS

| | | | |
|---|---|---|---|
| 6,824,952 | B1 | 11/2004 | Minsek et al. |
| 6,972,431 | B2 | 12/2005 | Forrest et al. |
| 7,129,466 | B2 | 10/2006 | Iwasaki |
| 7,141,863 | B1 | 11/2006 | Compaan et al. |
| 7,973,307 | B2 | 7/2011 | Rand et al. |
| 8,035,708 | B2 | 10/2011 | Takizawa et al. |
| 8,378,339 | B2 | 2/2013 | Nomura et al. |
| 8,426,727 | B2 | 4/2013 | Pfeiffer et al. |
| 8,471,246 | B2 | 6/2013 | Suzuki et al. |
| 8,525,577 | B2 | 9/2013 | Yofu et al. |
| 8,637,860 | B2 | 1/2014 | Nomura et al. |
| 8,704,213 | B2 | 4/2014 | Suzuki |
| 8,704,281 | B2 | 4/2014 | Maehara et al. |
| 8,847,141 | B2 | 9/2014 | Fukuzaki et al. |
| 8,847,208 | B2 | 9/2014 | Mitsui et al. |
| 8,860,016 | B2 | 10/2014 | Suzuki |
| 8,933,438 | B2 | 1/2015 | Leem et al. |
| 8,994,132 | B2 | 3/2015 | Mitsui et al. |
| 9,070,888 | B2 | 6/2015 | Leem et al. |
| 9,543,361 | B2 | 1/2017 | Leem et al. |
| 9,548,463 | B2 | 1/2017 | Yagi et al. |
| 9,960,362 | B2 | 5/2018 | Bulliard et al. |
| 2002/0137244 | A1* | 9/2002 | Chen .................. H01L 21/6835 438/22 |
| 2005/0217722 | A1 | 10/2005 | Komatsu et al. |
| 2007/0012955 | A1 | 1/2007 | Ihama |
| 2007/0063156 | A1 | 3/2007 | Hayashi |
| 2007/0090371 | A1 | 4/2007 | Drechsel et al. |
| 2010/0207112 | A1 | 8/2010 | Furst et al. |
| 2011/0012091 | A1 | 1/2011 | Forrest et al. |
| 2011/0074491 | A1 | 3/2011 | Yofu et al. |
| 2012/0126204 | A1 | 5/2012 | So et al. |
| 2012/0266958 | A1 | 10/2012 | Aksu et al. |
| 2012/0313088 | A1 | 12/2012 | Yofu et al. |
| 2013/0062595 | A1 | 3/2013 | Park et al. |
| 2013/0087682 | A1 | 4/2013 | Nomura |
| 2013/0125982 | A1* | 5/2013 | Oguri .................. H01L 31/0322 136/258 |
| 2013/0181202 | A1 | 7/2013 | Yofu et al. |
| 2014/0008619 | A1 | 1/2014 | Lee et al. |
| 2014/0054442 | A1 | 2/2014 | Huang et al. |
| 2014/0083496 | A1 | 3/2014 | Shibasaki et al. |
| 2014/0159752 | A1 | 6/2014 | Tsai et al. |
| 2014/0209173 | A1 | 7/2014 | Momose |
| 2014/0263945 | A1* | 9/2014 | Huang .................. H01L 51/428 250/200 |
| 2014/0319509 | A1 | 10/2014 | Hattori et al. |
| 2014/0332051 | A1* | 11/2014 | Cho .................. H01L 31/02167 136/244 |
| 2015/0053942 | A1 | 2/2015 | Kho et al. |
| 2015/0060775 | A1 | 3/2015 | Liang et al. |
| 2015/0162548 | A1 | 6/2015 | Lim et al. |
| 2015/0228811 | A1* | 8/2015 | Hiroi .................. H01L 31/02167 136/265 |
| 2015/0349073 | A1* | 12/2015 | Kang .................. H01L 29/4236 257/330 |
| 2016/0013248 | A1 | 1/2016 | Sawaki |
| 2016/0013424 | A1 | 1/2016 | Yamamoto et al. |
| 2016/0020258 | A1 | 1/2016 | Park et al. |
| 2016/0064672 | A1 | 3/2016 | Lee et al. |
| 2016/0099417 | A1 | 4/2016 | Sato et al. |
| 2016/0111561 | A1 | 4/2016 | Hsu et al. |
| 2016/0111651 | A1 | 4/2016 | Yun et al. |
| 2016/0126470 | A1 | 5/2016 | Ro et al. |
| 2016/0149132 | A1 | 5/2016 | Lim et al. |
| 2016/0197281 | A1* | 7/2016 | Momose ............... H01L 51/441 136/256 |
| 2016/0268401 | A1 | 9/2016 | Aleksov |
| 2017/0005142 | A1 | 1/2017 | Lee et al. |
| 2017/0074652 | A1 | 3/2017 | Send et al. |
| 2017/0117424 | A1 | 4/2017 | Hiroi et al. |
| 2017/0294589 | A1 | 10/2017 | Shibuya et al. |

FOREIGN PATENT DOCUMENTS

| | | |
|---|---|---|
| EP | 0529162 A1 | 3/1993 |
| EP | 2317582 A1 | 5/2011 |
| EP | 3026722 A1 | 6/2016 |
| JP | H09-311232 A | 12/1997 |
| JP | 10-91384 A | 4/1998 |
| JP | 2005-132914 A | 5/2005 |
| JP | 2006-261172 A | 9/2006 |
| JP | 2007-234650 A | 9/2007 |
| JP | 2009-274966 A | 11/2009 |
| JP | 2011-225544 A | 11/2011 |
| JP | 2011-253861 A | 12/2011 |
| JP | 2012-123292 A | 6/2012 |
| JP | 2012-151761 A | 8/2012 |
| JP | 2013-040147 A | 2/2013 |
| JP | 5323025 B2 | 10/2013 |
| JP | 2014-049559 A | 3/2014 |
| JP | 2014-210768 A | 11/2014 |
| JP | 2015-015415 A | 1/2015 |
| JP | 2015-043362 A | 3/2015 |
| JP | 2015-700600 A | 4/2015 |
| JP | 2015-092546 A | 5/2015 |
| KR | 10-2014-0106767 A | 9/2014 |
| KR | 10-2015-0066616 A | 6/2015 |
| KR | 10-2016-0009404 A | 1/2016 |
| KR | 10-2016-0024686 A | 3/2016 |
| KR | 10-2016-0052448 A | 5/2016 |
| KR | 10-2016-0062708 A | 6/2016 |
| WO | WO-2002/064600 A1 | 8/2002 |
| WO | WO-2008/0191670 A2 | 7/2008 |
| WO | WO-2010/011658 A2 | 1/2010 |
| WO | WO-2010/038721 A1 | 4/2010 |
| WO | WO-2014-157238 A1 | 10/2014 |
| WO | WO-2014/169270 A2 | 10/2014 |

OTHER PUBLICATIONS

European Search Report for corresponding European Application No. 17150423.6-1555 dated Aug. 4, 2017.
Advanced Materials (1997), 9(2), 132-135.
Jap. J. Appl. Phys. 46(49), 2007, L1240-L1242.
IEEE Trans. Electron. Dev., 56(11), 2009, 2570.
IDW '09, INP 1-4.
Scientific Reports 5, Article No. 7708 (2015).
Journal of Synthetic Organic Chemistry, Japan, vol. 63 (2005) No. 9 p. 911-920.
The Biophysical Society of Japan, vol. 2, pp. 23-34 (2006).
J. Phys. Chem. A 2013, 117, 9259-9265.
Extended European Search Report dated May 22, 2017, for corresponding European Patent Application No. 17161078.5.
Juha Alakarhu, "Image Sensors and Image Quality in Mobile Phones", International Image Sensor Workshop, 2007, pp. 1-4.

(56) References Cited

OTHER PUBLICATIONS

Hokuto Seo et al. "Color Sensors with Three Vertically Stacked Organic Photodetectors". Japanese Journal of Applied Physics, vol. 46, No. 49. The Japan Society of Applied Physics. 2007. pp. L1240-L1242.

I.G. Hill et al., Organic Electronics, "Metal-dependent charge transfer and chemical interaction at interfaces between 3, 4, 9, 10-perylenetetracarboxylic bisimidazole and gold, silver, and magnesium", vol. 1, Issue 1, Dec. 2000, pp. 5-13.

Drechsel J. et al: "Efficient organic solar cells based on a double p-i-n architecture using doped wide-gap transport layers", Applied Physics Letters, AIP Publishing LLC, US, vol. 86, No. 24, Jun. 7, 2005 (Jun. 7, 2005), pp. 244102-244102, XP012065900, ISSN: 0003-6951, DOI: 10.1063/1.1935771.

Marzena Grucela-Zajac et al., "(Photo)physical Properties of New Molecular Glasses End-Capped with Thiophene Rings Composed of Diimide and Imine Units", The Journal of Physical Chemistry, May 21, 2014, pp. 13070-13086, ACS Author Choice.

Gorkem Memisoglu et al., "Highly Efficient Organic UV Photodetectors Based on Polyfluorene and Naphthalenediimide Blends: Effect of Thermal Annealing", 2012, International Journal of Photoenergy vol. 2012, Article ID 936075, 11 pages, Hindawi Publishing Corporation.

Jiri Misek et al., "A Chiral and Colorful Redox Switch: Enhanced p Acidity in Action", 2010, Angew. Chem. Int. Ed, 2010, 49, 7680 -7683, Wiley-VCH Verlag GmbH & Co. KGaA, Weinheim.

European Search Report dated Apr. 26, 2017 issued in corresponding European Application No. 16195944.0.

European Search Report for Application No. 17177002.7 dated Nov. 17, 2017.

European Search Report issued in corresponding European Patent Application No. 17150423.6-1555 dated Aug. 4, 2017.

U.S. Notice of Allowance dated Dec. 20, 2017 issued in co-pending U.S. Appl. No. 15/609,125.

U.S. Office Action dated Feb. 14, 2018 issued in co-pending U.S. Appl. No. 15/272,580.

U.S. Office Action dated Jan. 5, 2018 issued in co-pending U.S. Appl. No. 15/362,964.

U. S. Office Action dated Jun. 1, 2018 issued in co-pending U.S. Appl. No. 15/362,964.

U.S. Office Action dated Jul. 3, 2017 issued in copending U.S. Appl. No. 15/255,649.

U.S. Office Action dated Jan. 29, 2018 issued in co-pending U.S. Appl. No. 15/255,649.

European Search Report dated Apr. 26, 2017 issued in corresponding European Application No. 16195944.0-1552.

I.G. Hill et al., Organic Electronics, "Metal-dependent charge transfer and chemical interaction at interfaces between 3,4,9,10-perylenetetracarboxylic bisimidazole and gold, silver and magnesium", Department of Electrical Engineering, Princetion Materials Institute, Feb. 2000, pp. 5-13.

U.S. Office Action dated Jul. 25, 2018 issued in co-pending U.S. Appl. No. 15/272,580.

U.S. Office Action dated Aug. 6, 2018 issued in co-pending U.S. Appl. No. 15/623,801.

Final Office Action issued for co-pending U.S. Appl. No. 15/255,649 dated Aug. 30, 2018.

* cited by examiner

ORGANIC PHOTOELECTRONIC DEVICE AND IMAGE SENSOR

CROSS-REFERENCE TO RELATED APPLICATIONS

This application is a divisional of U.S. application Ser. No. 15/362,964, filed on Nov. 29, 2016, issued as U.S. Pat. No. 10,236,461, which claims priority to and the benefit of Korean Patent Application No. 10-2016-0062362 filed in the Korean Intellectual Property Office on May 20, 2016, the entire contents of each of which are incorporated herein by reference.

BACKGROUND

1. Field

Example embodiments relate to organic photoelectronic devices and image sensors.

2. Description of the Related Art

A photoelectronic device may convert light into an electrical signal using photoelectric effects. A photoelectronic device may include a photodiode, a phototransistor, and the like. A photoelectronic device may be applied to (e.g., included in) various devices, including image sensors, a solar cell, an organic light emitting diode, some combination thereof, or the like.

An image sensor including a photodiode requires high resolution and thus a smaller pixel. At present, a silicon photodiode is widely used. In some cases, a silicon photodiode exhibits deteriorated sensitivity because of a relatively small absorption area due to relatively small pixels thereof. Accordingly, an organic material that is capable of replacing silicon has been researched.

An organic material has a relatively high extinction coefficient and selectively absorbs light in a particular wavelength region depending on a molecular structure, and thus may simultaneously replace a photodiode and a color filter and resultantly improve sensitivity and contribute to high integration.

However, the organic material may be different from silicon due to having a relatively higher binding energy than silicon and exhibiting a recombination behavior. Thus, an organic photoelectronic device that includes the organic material may exhibit a relatively low photoelectronic conversion efficiency, and thus relatively low photoelectronic conversion performance, relative to a silicon-based photoelectronic device.

SUMMARY

Some Example embodiments provide an organic photoelectronic device capable of lowering a driving voltage and a leakage current while reducing and/or preventing efficiency deterioration.

Some example embodiments provide an image sensor including the organic photoelectronic device.

According to some example embodiments, an organic photoelectronic device may include a first electrode; a second electrode on the first electrode; a photoelectronic conversion layer between the first electrode and the second electrode; and a buffer layer between the first electrode and the photoelectronic conversion layer. The photoelectronic conversion layer may include a p-n junction, the p-n junction including a first light absorbing material and a second light absorbing material. The buffer layer may include the first light absorbing material and a non-absorbing material associated with a visible wavelength spectrum of light, the non-absorbing material having a highest occupied molecular orbital (HOMO) energy level of about 5.4 eV to about 5.8 eV.

The first light absorbing material may be configured to selectively absorb light within one of a red wavelength spectrum of light, a green wavelength spectrum of light, and a blue wavelength spectrum of light.

The first light absorbing material may be configured to selectively absorb a green wavelength spectrum of light having a maximum absorption wavelength ($\lambda_{max}$) of about 520 nm to about 580 nm.

The photoelectronic conversion layer and the buffer layer may be in contact with each other.

The buffer layer may include a first buffer layer that is adjacent to the first electrode and includes the non-absorbing material associated with the visible wavelength spectrum of light, and a second buffer layer that is adjacent to the photoelectronic conversion layer and includes the first light absorbing material.

The buffer layer may include a mixture of the first light absorbing material and the non-absorbing material associated with the visible wavelength spectrum of light.

The buffer layer may include a first buffer layer that is adjacent to the first electrode and includes the non-absorbing material associated with the visible wavelength spectrum of light, and a second buffer layer that is adjacent to the photoelectronic conversion layer and includes a mixture of the first light absorbing material and the non-absorbing material associated with the visible wavelength spectrum of light.

The buffer layer may include a first buffer layer that is adjacent to the first electrode and includes the non-absorbing material associated with the visible wavelength spectrum of light, a second buffer layer that is adjacent to the photoelectronic conversion layer and includes the first light absorbing material, and a third buffer layer that is between the first buffer layer and the second buffer layer and includes a mixture of the first light absorbing material and the non-absorbing material associated with the visible wavelength spectrum of light.

The non-absorbing material associated with the visible wavelength spectrum of light may be a compound represented by Chemical Formula 1A or 1B,

[Chemical Formula 1A]

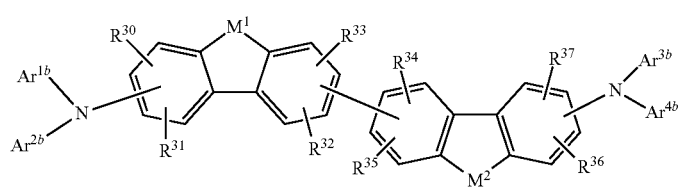

-continued

[Chemical Formula 1B]

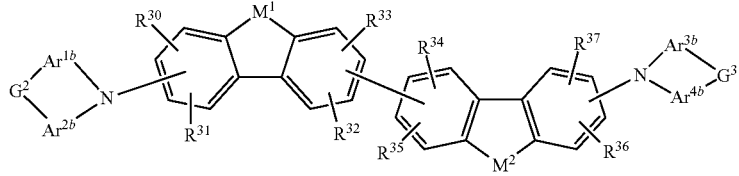

wherein, in Chemical Formula 1A or 1B, each of $M^1$ and $M^2$ are independently $CR^nR^o$, $SiR^pR^q$, $NR^r$, O, S, Se, or Te, each of $Ar^{1b}$, $Ar^{2b}$, $Ar^{3b}$, and $Ar^{4b}$ are independently a substituted or unsubstituted $C_6$ to $C_{30}$ aryl group or a substituted or unsubstituted $C_3$ to $C_{30}$ heteroaryl group, each of $G^2$ and $G^3$ are independently a single bond, $-(CR^sR^t)_{n3}-$, $-O-$, $-S-$, $-Se-$, $-N=$, $-NR^u-$, $-SiR^vR^w-$ or $-GeR^xR^y-$, wherein n3 is 1 or 2, and each of $R^{30}$ to $R^{37}$ and $R^n$ to $R^y$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heterocyclic group, a substituted or unsubstituted $C_1$ to $C_6$ alkoxy group, a halogen, or a cyano group.

The first light absorbing material may have a core structure including an electron donating moiety, a pi-conjugation linker, and an electron accepting moiety.

The first light absorbing material may be a compound represented by Chemical Formula 2,

[Chemical Formula 2]

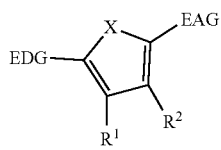

wherein, in Chemical Formula 2, X is Se, Te, SO, $SO_2$, or $SiR^aR^b$, EDG is an electron donating group, EAG is an electron accepting group, and each of $R^1$, $R^2$, $R^a$, and $R^b$ are independently hydrogen or a monovalent substituent.

The first light absorbing material may be a compound represented by Chemical Formula 2A or 2B,

[Chemical Formula 2A]

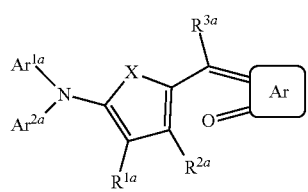

[Chemical Formula 2B]

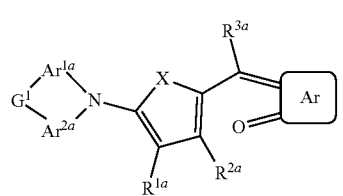

wherein, in Chemical Formula 2A or 2B, X is Se, Te, SO, $SO_2$, or $SiR^aR^b$, Ar is a substituted or unsubstituted 5-membered ring, a substituted or unsubstituted 6-membered ring, or a fused ring of two or more rings, each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group, each of $Ar^{1a}$ and $Ar^{2a}$ are independently present or are linked to each other to provide a ring, $G^1$ is selected from a single bond, $-(CR^gR^h)_{n2}-$, $-O-$, $-S-$, $-Se-$, $-N=$, $-NR^i-$, $-SiR^jR^k-$, and $-GeR^lR^m-$, wherein n2 is 1 or 2, and each of $R^{1a}$ to $R^{3a}$, $R^a$, and $R^b$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group.

The first light absorbing material may be a compound represented by one of Chemical Formulae 2A-1 to 2A-4,

[Chemical Formula 2A-1]

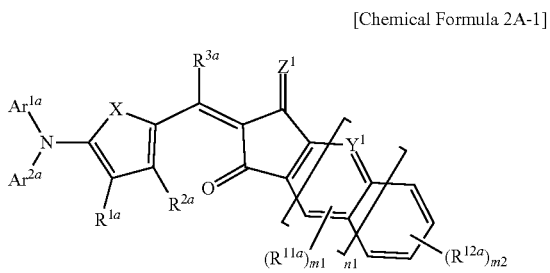

[Chemical Formula 2A-2]

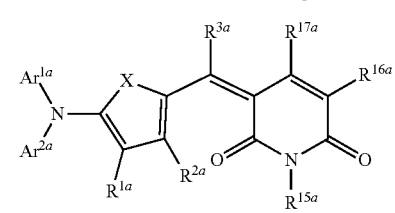

[Chemical Formula 2A-3]

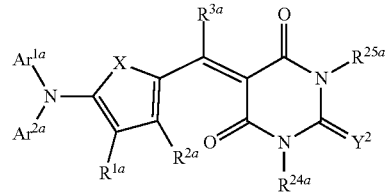

[Chemical Formula 2A-4]

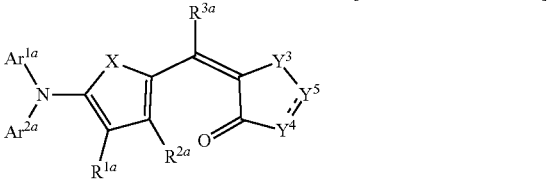

wherein, in Chemical Formulae 2A-1 to 2A-4, X is Se, Te, SO, $SO_2$, or $SiR^aR^b$, $Z^1$ is O or $CR^cR^d$, $Y^1$ is N or $CR^e$, $Y^2$ is selected from O, S, Se, Te, and C(R$^f$)(CN), Y$^3$ is O, S, Se, or Te, Y$^4$ is N or NR$^{18a}$, Y$^5$ is CR$^{19a}$ or C=CR$^{20a}$(CN), each of Ar$^{1a}$ and Ar$^{2a}$ are independently a substituted or unsubstituted C$_6$ to C$_{30}$ aryl group or a substituted or unsubstituted C$_3$ to C$_{30}$ heteroaryl group, each of R$^{1a}$ to R$^{3a}$, R$^{11a}$, R$^{12a}$, R$^{15a}$ to R$^{20a}$, R$^{24a}$, R$^{25a}$, and R$^a$ to R$^f$ are independently hydrogen, a substituted or unsubstituted C$_1$ to C$_{30}$ alkyl group, a substituted or unsubstituted C$_6$ to C$_{30}$ aryl group, a substituted or unsubstituted C$_3$ to C$_{30}$ heteroaryl group, a substituted or unsubstituted C$_1$ to C$_6$ alkoxy group, a halogen, or a cyano group, n1 is 0 or 1, m1 is 0 or 1, and m2 is an integer inclusively between 0 and 4.

The first light absorbing material may be a compound represented by one of Chemical Formulae 2B-1 to 2B-4,

[Chemical Formula 2B-1]

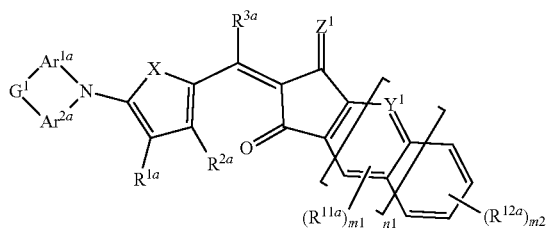

[Chemical Formula 2B-2]

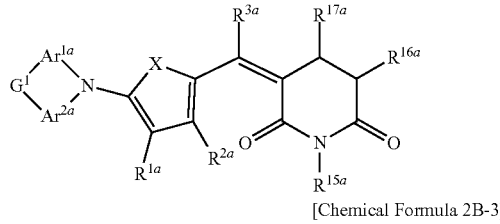

[Chemical Formula 2B-3]

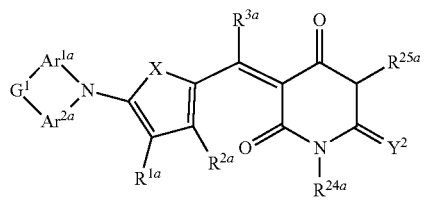

[Chemical Formula 2B-4]

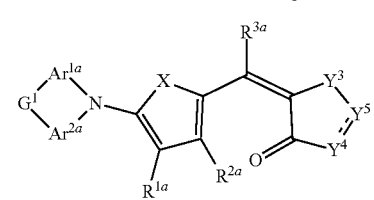

wherein, in Chemical Formulae 2B-1 to 2B-4, X is Se, Te, SO, SO$_2$, or SiR$^a$R$^b$, Z$^1$ is O or CR$^c$R$^d$, Y$^1$ is N or CR$^e$, Y$^2$ is selected from O, S, Se, Te, and C(R$^f$)(CN), Y$^3$ is O, S, Se, or Te, Y$^4$ is N or NR$^{18a}$, Y$^5$ is CR$^{19a}$ or C=CR$^{20a}$(CN), each of Ar$^{1a}$ and Ar$^{2a}$ are independently a substituted or unsubstituted C$_6$ to C$_{30}$ aryl group or a substituted or unsubstituted C$_3$ to C$_{30}$ heteroaryl group, G$^1$ is selected from —(CR$^g$R$^h$)$_{n2}$—, —O—, —S—, —Se—, —N=, —NR$^i$—, —SiR$^j$R$^k$—, and —GeR$^l$R$^m$—, and each of R$^{1a}$ to R$^{3a}$, R$^{11a}$, R$^{12a}$, R$^{15a}$ to R$^{20a}$, R$^{24a}$, R$^{25a}$, and R$^a$ to R$^m$ are independently hydrogen, a substituted or unsubstituted C$_1$ to C$_{30}$ alkyl group, a substituted or unsubstituted C$_6$ to C$_{30}$ aryl group, a substituted or unsubstituted C$_3$ to C$_{30}$ heteroaryl group, a substituted or unsubstituted C$_1$ to C$_6$ alkoxy group, a halogen, or a cyano group, n1 is 0 or 1, n2 is 0, 1, or 2, m1 is 0 or 1, and m2 is an integer inclusively between 0 and 4.

The photoelectronic conversion layer may include an intrinsic layer. The intrinsic layer may include a first region that is proximate to the first electrode, a second region that is proximate to the second electrode, and a third region that is between the first region and the second region in a thickness direction. The first region may include a first composition ratio of the first light absorbing material relative to the second light absorbing material, the second region may include a second composition ratio of the first light absorbing material relative to the second light absorbing material, the third region may include a third composition ratio of the first light absorbing material relative to the second light absorbing material, and the third composition ratio may be different from each of the first composition ratio and the second composition ratio.

The first light absorbing material may be configured to selectively absorb a green wavelength spectrum of light having a maximum absorption wavelength ($\lambda_{max}$) of about 520 nm to about 580 nm, and the second light absorbing material may include fullerene or a fullerene derivative.

The buffer layer may have a thickness of about 2 nm to about 40 nm.

The first electrode may be an anode and the second electrode may be a cathode.

An image sensor may include the photoelectronic device.

An electronic device may include the image sensor.

According to some example embodiments, an organic photoelectronic device may include a photoelectronic conversion layer including a p-n junction, the p-n junction including a first light absorbing material and a second light absorbing material; and a buffer layer adjacent to the photoelectronic conversion layer, the buffer layer including the first light absorbing material and a non-absorbing material associated with a visible wavelength spectrum of light, the non-absorbing material having an energy bandgap of greater than or equal to about 2.8 eV.

The buffer layer may include a first buffer layer distal from the photoelectronic conversion layer, the first buffer layer including the non-absorbing material associated with the visible wavelength spectrum of light, and a second buffer layer proximate to the photoelectronic conversion layer, the second buffer layer including the first light absorbing material.

The buffer layer may include a mixture of the first light absorbing material and the non-absorbing material associated with the visible wavelength spectrum of light.

The buffer layer may include a first buffer layer distal from the photoelectronic conversion layer, the first buffer layer including the non-absorbing material associated with the visible wavelength spectrum of light, and a second buffer layer proximate to the photoelectronic conversion layer, the second buffer layer including a mixture of the first light absorbing material and the non-absorbing material associated with the visible wavelength spectrum of light.

The buffer layer may include, a first buffer layer distal from the photoelectronic conversion layer, the first buffer layer including the non-absorbing material associated with the visible wavelength spectrum of light, a second buffer layer proximate to the photoelectronic conversion layer, the second buffer layer including the first light absorbing material, and a third buffer layer between the first buffer layer and the second buffer layer, the third buffer layer including a mixture of the first light absorbing material and the non-absorbing material associated with the visible wavelength spectrum of light.

The non-absorbing material associated with the visible wavelength spectrum of light may be a compound represented by Chemical Formula 1A or 1B,

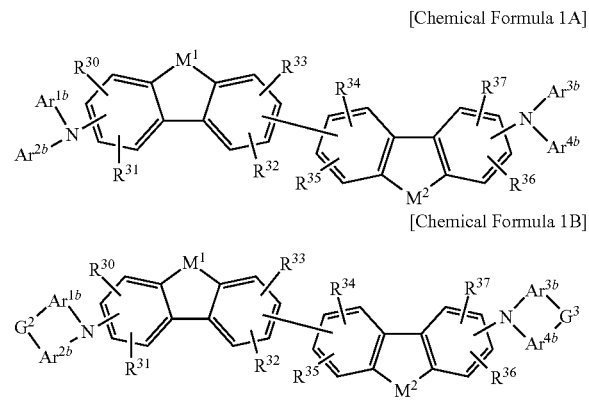

[Chemical Formula 1A]

[Chemical Formula 1B]

wherein, in Chemical Formula 1A or 1B, each of $M^1$ and $M^2$ are independently $CR''R^o$, $SiR^pR^q$, $NR^r$, O, S, Se, or Te, each of $Ar^{1b}$, $Ar^{2b}$, $Ar^{3b}$, and $Ar^{4b}$ are independently a substituted or unsubstituted $C_6$ to $C_{30}$ aryl group or a substituted or unsubstituted $C_3$ to $C_{30}$ heteroaryl group, each of $G^2$ and $G^3$ are independently a single bond, $-(CR^sR^t)_{n3}-$, $-O-$, $-S-$, $-Se-$, $-N=$, $-NR^u-$, $-SiR^vR^w-$ or $-GeR^xR^y-$, wherein n3 is 1 or 2, and each of $R^{30}$ to $R^{37}$ and $R''$ to $R^y$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heterocyclic group, a substituted or unsubstituted $C_1$ to $C_6$ alkoxy group, a halogen, or a cyano group.

The photoelectronic conversion layer and the buffer layer may be in contact with each other.

conversion layer, the buffer layer including the first light absorbing material and a non-absorbing material associated with a visible wavelength spectrum of light, the non-absorbing material having a highest occupied molecular orbital (HOMO) energy level of about 5.4 eV to about 5.8 eV.

The buffer layer may include a first buffer layer distal from the photoelectronic conversion layer, the first buffer layer including the non-absorbing material associated with the visible wavelength spectrum of light, and a second buffer layer proximate to the photoelectronic conversion layer, the second buffer layer including the first light absorbing material.

The buffer layer may include a mixture of the first light absorbing material and the non-absorbing material associated with the visible wavelength spectrum of light.

The buffer layer may include a first buffer layer distal from the photoelectronic conversion layer, the first buffer layer including the non-absorbing material associated with the visible wavelength spectrum of light, and a second buffer layer proximate to the photoelectronic conversion layer, the second buffer layer including a mixture of the first light absorbing material and the non-absorbing material associated with the visible wavelength spectrum of light.

The buffer layer may include, a first buffer layer distal from the photoelectronic conversion layer, the first buffer layer including the non-absorbing material associated with the visible wavelength spectrum of light, a second buffer layer proximate to the photoelectronic conversion layer, the second buffer layer including the first light absorbing material, and a third buffer layer between the first buffer layer and the second buffer layer, the third buffer layer including a mixture of the first light absorbing material and the non-absorbing material associated with the visible wavelength spectrum of light.

The non-absorbing material associated with the visible wavelength spectrum of light may be a compound represented by Chemical Formula 1A or 1B,

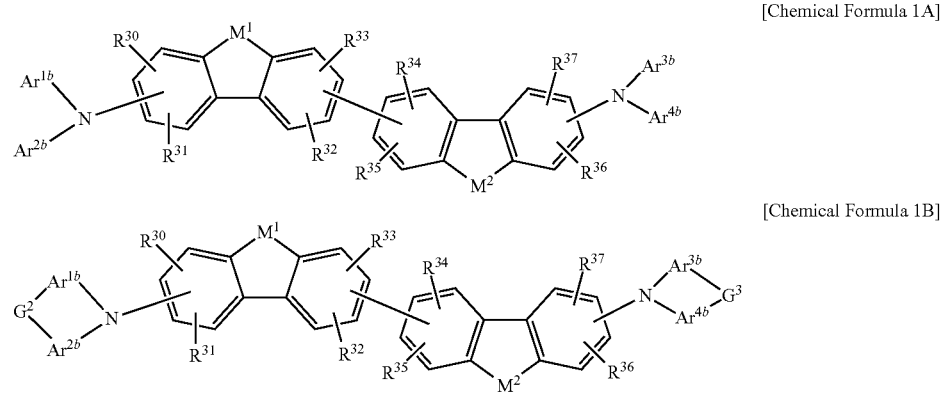

[Chemical Formula 1A]

[Chemical Formula 1B]

The buffer layer may have a thickness of about 2 nm to about 40 nm.

An electronic device may include the organic photoelectronic device.

According to some example embodiments, an organic photoelectronic device may include a photoelectronic conversion layer including a p-n junction, the p-n junction including a first light absorbing material and a second light absorbing material; and a buffer layer on the photoelectronic wherein, in Chemical Formula 1A or 1B, each of $M^1$ and $M^2$ are independently $CR''R^o$, $SiR^pR^q$, $NR^r$, O, S, Se, or Te, each of $Ar^{1b}$, $Ar^{2b}$, $Ar^{3b}$, and $Ar^{4b}$ are independently a substituted or unsubstituted $C_6$ to $C_{30}$ aryl group or a substituted or unsubstituted $C_3$ to $C_{30}$ heteroaryl group, each of $G^2$ and $G^3$ are independently a single bond, $-(CR^sR^t)_{n3}-$, $-O-$, $-S-$, $-Se-$, $-N=$, $-NR^u-$, $-SiR^vR^w-$ or $-GeR^xR^y-$, wherein n3 is 1 or 2, and each of $R^{30}$ to $R^{37}$ and $R''$ to $R^y$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heterocyclic group, a substituted or unsubstituted $C_1$ to $C_6$ alkoxy group, a halogen, or a cyano group.

The photoelectronic conversion layer and the buffer layer may be in contact with each other.

The buffer layer may have a thickness of about 2 nm to about 40 nm.

An electronic device may include the organic photoelectronic device.

DETAILED DESCRIPTION

Figure 1A:
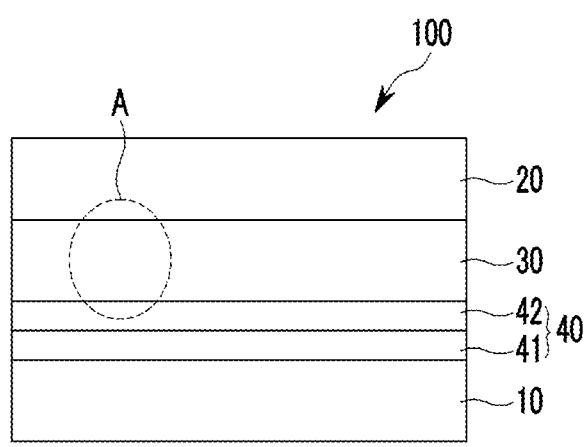
FIG. 1A is a cross-sectional view showing an organic photoelectronic device according to some example embodiments.

Hereinafter, embodiments will hereinafter be described in detail, and may be easily performed by those who have common knowledge in the related art. However, this disclosure may be embodied in many different forms and is not to be construed as limited to the exemplary embodiments set forth herein.

In the drawings, the thickness of layers, films, panels, regions, etc., are exaggerated for clarity. Like reference numerals designate like elements throughout the specification. It will be understood that when an element, including a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, a combination thereof refers to a mixture and a stacking structure of two or more.

As used herein, when specific definition is not otherwise provided, the term "substituted" refers to replacement of hydrogen atom by a substituent selected from a halogen, a hydroxy group, an alkoxy group, a nitro group, a cyano group, an amino group, an azido group, an amidino group, a hydrazino group, a hydrazono group, a carbonyl group, a carbamoyl group, a thiol group, ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ aryl alkyl group, a $C_1$ to $C_{30}$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_3$ to $C_{30}$ heterocycloalkyl group, and a combination thereof.

Hereinafter, an organic photoelectronic device according to some example embodiments is described with reference to drawings.

FIG. 1A is a cross-sectional view showing an organic photoelectronic device according to some example embodiments.

Referring to FIG. 1A, an organic photoelectronic device 100 according to some example embodiments includes a first electrode 10 and a second electrode 20 facing each other, a photoelectronic conversion layer 30 between the first electrode 10 and the second electrode 20, and a buffer layer 40 between the first electrode 10 and the photoelectronic conversion layer 30.

A substrate (not shown) may be disposed on a side of the first electrode 10 and a side of the second electrode 20. The substrate may at least partially comprise, for example, an inorganic material including glass, an organic material including polycarbonate, polymethylmethacrylate, polyethylene terephthalate, polyethylene naphthalate, polyamide, polyethersulfone, or a combination thereof, or a silicon wafer.

One of the first electrode 10 and the second electrode 20 is an anode, and the other is a cathode. For example, the first electrode 10 is an anode, and the second electrode 20 is a cathode.

At least one of the first electrode 10 and the second electrode 20 may be a light-transmitting electrode, and the light-transmitting electrode may at least partially comprise, for example, a conductive oxide such as indium tin oxide (ITO) or indium zinc oxide (IZO), zinc oxide (ZnO), tin oxide (SnO), aluminum tin oxide (AlTO), and fluorine doped tin oxide (FTO), or a metal thin layer of a thin monolayer or multilayer. When one of the first electrode 10 and the second electrode 20 is a non-light-transmitting electrode, it may at least partially comprise, for example, an opaque conductor including aluminum (Al), silver (Ag), or gold (Au). For example, the first electrode 10 and the second electrode 20 are light-transmitting electrodes.

The photoelectronic conversion layer 30 includes a first light absorbing material and a second light absorbing material to form a p-n junction. One of the first light absorbing material and the second light absorbing material may be a p-type semiconductor and the other may be an n-type semiconductor. For example, the first light absorbing material may be a p-type semiconductor and the second light absorbing material may be an n-type semiconductor. At least one of the first light absorbing material and the second light absorbing material may be an organic material. The photoelectronic conversion layer 30 absorbs external light to generate excitons and then separates the generated excitons into holes and electrons.

The photoelectronic conversion layer 30 may be configured to absorb light in at least one part of a wavelength spectrum of light, for example one of a green wavelength spectrum of light, also referred to herein as a wavelength spectrum of green light (e.g., light having a wavelength of about 500 nm to about 600 nm), a blue wavelength spectrum of light, also referred to herein as a wavelength spectrum of blue light (e.g., light having a wavelength of greater than or equal to about 380 nm and less than about 500 nm), and a red wavelength spectrum of light, also referred to herein as a wavelength spectrum of red light (e.g., light having a wavelength of greater than about 600 nm and less than or equal to about 780 nm).

In some example embodiments, at least one of the first light absorbing material and the second light absorbing material may selectively absorb one of green light, blue light, and red light. For example, the first light absorbing material may selectively absorb one of green light, blue light, and red light.

In some example embodiments, at least one of the first light absorbing material and the second light absorbing material may selectively absorb a wavelength spectrum of green light having a maximum absorption wavelength ($\lambda_{max}$) of about 520 nm to about 580 nm. For example, the first light absorbing material may selectively absorb a wavelength spectrum of green light having a maximum absorption wavelength ($\lambda_{max}$) of about 520 nm to about 580 nm.

In some example embodiments, at least one of the first light absorbing material and the second light absorbing material may be an organic material configured to selectively absorb light in a green wavelength spectrum having a maximum absorption wavelength ($\lambda_{max}$) of about 520 nm to about 580 nm. The first light absorbing material may be an organic material configured to selectively absorb light in a green wavelength spectrum having a maximum absorption wavelength ($\lambda_{max}$) of about 520 nm to about 580 nm.

In some example embodiments, one of the first light absorbing material and the second light absorbing material may be an organic material configured to selectively absorb light in a green wavelength spectrum having a maximum absorption wavelength ($\lambda_{max}$) of about 520 nm to about 580 nm and the other of the first light absorbing material and the second light absorbing material may be fullerene or a fullerene derivative. The first light absorbing material may be an organic material configured to selectively absorb light in a green wavelength spectrum having a maximum absorption wavelength ($\lambda_{max}$) of about 520 nm to about 580 nm and the second light absorbing material may be fullerene or a fullerene derivative.

In some example embodiments, the first light absorbing material may be an organic material having an energy bandgap of about 1.7 eV to about 2.3 eV. If and/or when the energy bandgap is within a particular range, including a range of about 1.7 eV to about 2.3 eV, light in a green wavelength spectrum of light having a maximum absorption wavelength ($\lambda_{max}$) of about 520 nm to about 580 nm may be selectively absorbed and external quantum efficiency (EQE) may increase, and thus photoelectric conversion efficiency is improved. The first light absorbing material may be an organic material having an energy bandgap of about 1.8 eV to about 2.2 eV, for example about 1.9 eV to about 2.1 eV.

In some example embodiments, the first light absorbing material may have a core structure including an electron donating moiety, a pi-conjugation linker, and an electron accepting moiety. The electron-donating moiety may donate electrons to form holes if and/or when it receives light and the electron-accepting moiety may receive electrons if and/or when it receives light. The first light absorbing material will be described later.

Figure 1B:
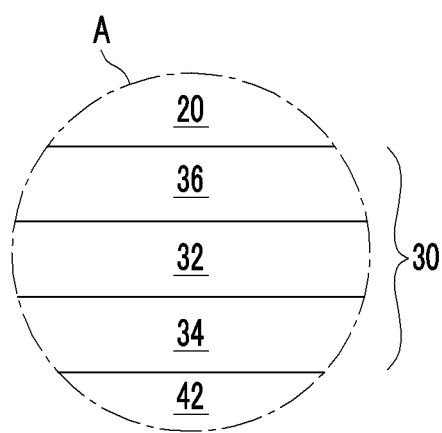
FIG. 1B is a cross-sectional view showing a portion of the organic photoelectronic device of FIG. 1A.

In some example embodiments, including the example embodiments illustrated in FIG. 1B, the photoelectronic conversion layer 30 may include an intrinsic layer (I layer)

32 including the first light absorbing material and the second light absorbing material. The intrinsic layer 32 may include the first light absorbing material and the second light absorbing material in a composition ratio, for example about 10:1 to about 1:10, about 8:2 to about 2:8, or about 6:4 to about 4:6. Herein, the composition ratio may be a volume ratio.

The intrinsic layer 32 may have the same or different composition ratios of the first light absorbing material and the second light absorbing material in a thickness direction. For example, the intrinsic layer 32 may have the same composition ratios of the first light absorbing material and the second light absorbing material. In some example embodiments, the intrinsic layer 32 may include a plurality of regions having different composition ratios of the first light absorbing material and the second light absorbing material in a thickness direction.

In some example embodiments, the intrinsic layer 32 may include a first region close to the first electrode 10, a second region close to the second electrode 20, and a third region between the first region and the second region in a thickness direction, wherein a composition ratio of the first light absorbing material and the second light absorbing material in the third region is different from a composition ratio of the first light absorbing material and the second light absorbing material in the first region and the second region. For example, the composition ratio of the first light absorbing material relative to the second light absorbing material in the third region (hereinafter, referred to as a 'third composition ratio') may be different from the composition ratio of the first light absorbing material relative to the second light absorbing material in the first region (hereinafter, referred to as a 'first composition ratio') and from the composition ratio of the first light absorbing material relative to the second light absorbing material in the second region (hereinafter, referred to as a 'second composition ratio'). In some example embodiments, when the first light absorbing material is a p-type semiconductor, and the second light absorbing material is an n-type semiconductor, the third composition ratio ($p_3/n_3$) may be larger or smaller than the first composition ratio ($p_1/n_1$) and the second composition ratio ($p_2/n_2$). In some example embodiments, the first composition ratio (p1/n1) may be the same as the second composition ratio ($p_2/n_2$). In some example embodiments, the first composition ratio ($p_1/n_1$) may be different from the second composition ratio ($p_2/n_2$).

The photoelectronic conversion layer 30 may further include a p-type layer 34 and/or an n-type layer 36 on one surface or both surfaces of the intrinsic layer 32. The p-type layer 34 may include a p-type semiconductor that is one of the first light absorbing material and the second light absorbing material. The n-type layer 36 may include an n-type semiconductor that is another one of the first light absorbing material and the second light absorbing material. In some example embodiments, the photoelectronic conversion layer 30 may include a p-type layer 34/I layer 32, an I layer 32/n-type layer 36, a p-type layer 34/I layer 32/n-type layer 36, and the like.

The photoelectronic conversion layer 30 may include a p-type layer 34 and an n-type layer 36. The p-type layer 34 may include a p-type semiconductor that is one of the first light absorbing material and the second light absorbing material, and the n-type layer 36 may include an n-type semiconductor that is another one of the first light absorbing material and the second light absorbing material.

The photoelectronic conversion layer 30 may have a thickness of about 1 nm to about 500 nm, and specifically, about 5 nm to about 300 nm. If and/or when the photoelectronic conversion layer 30 has a thickness within the range of about 5 nm to about 300 nm, the photoelectronic conversion layer may be configured to effectively absorb light, effectively separate holes from electrons, and transfer them, thereby effectively improving photoelectronic conversion efficiency.

The buffer layer 40 is between the first electrode 10 and the photoelectronic conversion layer 30. One surface of the buffer layer 40 may be in contact with the first electrode 20 without interlayers therebetween and the other surface of the buffer layer 40 may be in contact with the photoelectronic conversion layer 30 without interlayers therebetween.

The buffer layer 40 includes a first buffer layer 41 that is adjacent to the first electrode 10 and a second buffer layer 42 that is adjacent to the photoelectronic conversion layer 30.

The first buffer layer 41 may be in contact with the first electrode 10 and may include a non-absorbing material associated with a visible wavelength spectrum of light. The non-absorbing material associated with a visible wavelength spectrum of light may include a material that does not substantially absorb light in a visible wavelength spectrum of light, for example a non-absorbing organic material associated with a visible wavelength spectrum of light. The non-absorbing material associated with a visible wavelength spectrum of light may include a charge buffer material, a hole buffer material, an electron buffer material, some combination thereof, or the like. For example the non-absorbing material associated with a visible wavelength spectrum of light may be a hole injection material, a hole transport material, a hole blocking material, an electron injection material, an electron transport material, an electron blocking material, some combination thereof, or the like.

In some example embodiments, the non-absorbing material associated with a visible wavelength spectrum of light may have an energy bandgap of greater than or equal to about 2.8 eV, for example greater than or equal to about 3.0 eV. The non-absorbing material associated with a visible wavelength spectrum of light may have an energy bandgap of for example about 2.8 eV to about 4.0 eV, or about 3.0 eV to about 3.8 eV.

In some example embodiments, the non-absorbing material associated with a visible wavelength spectrum of light (e.g., a wavelength spectrum of light that is inclusively within about 390 nm to about 700 nm) may have a highest occupied molecular orbital (HOMO) energy level of about 5.4 eV to about 5.8 eV or about 5.50 eV to 5.75 eV. Herein, the HOMO energy level refers to an absolute value where a vacuum level is 0 eV.

In some example embodiments, the non-absorbing material associated with a visible wavelength spectrum of light may be a compound represented by Chemical Formula 1A or 1B, but is not limited thereto.

[Chemical Formula 1A]

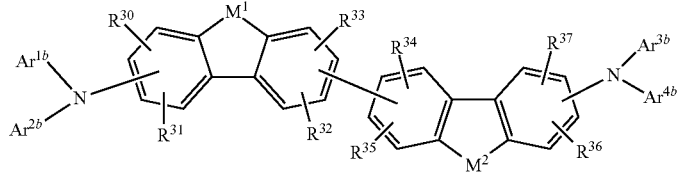

[Chemical Formula 1B]

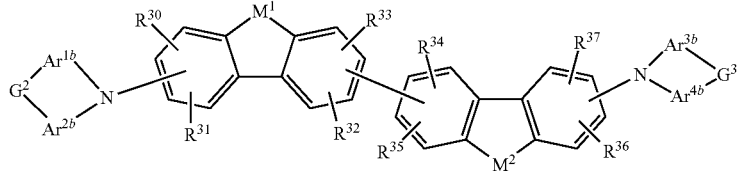

In Chemical Formula 1A or 1B, each of $M^1$ and $M^2$ are independently $CR''R^o$, $SiR^pR^q$, $NR^r$, O, S, Se, or Te, each of $Ar^{1b}$, $Ar^{2b}$, $Ar^{3b}$, and $Ar^{4b}$ are independently a substituted or unsubstituted $C_6$ to $C_{30}$ aryl group or a substituted or unsubstituted $C_3$ to $C_{30}$ heteroaryl group, each of $G^2$ and $G^3$ are independently a single bond, $-(CR^sR^t)_{n3}-$, $-O-$, $-S-$, $-Se-$, $-N=$, $-NR^u-$, $-SiR^vR^w-$ or $-GeR^xR^y-$, wherein n3 is 1 or 2, and each of $R^{30}$ to $R^{37}$ and $R''$ to $R^y$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heterocyclic group, a substituted or unsubstituted $C_1$ to $C_6$ alkoxy group, a halogen, or a cyano group.

The compound represented by Chemical Formula 1A or 1B has hole characteristics, wherein the compound donates electrons if and/or when it receives light and forms holes, and the holes separated from the photoelectronic conversion layer 30 easily move along a HOMO energy level and block movement of the electrons. The compound represented by Chemical Formula 1A or 1B may have hole injection characteristics, hole transport characteristics, and/or electron block characteristics and thus may be configured to increase hole injection and transport properties and effectively block the electrons from the photoelectronic conversion layer 30 to the first electrode 10.

In some example embodiments, the non-absorbing material associated with a visible wavelength spectrum of light may be a compound represented by Chemical Formula 1A-1 or 1B-1, but is not limited thereto.

[Chemical Formula 1A-1]

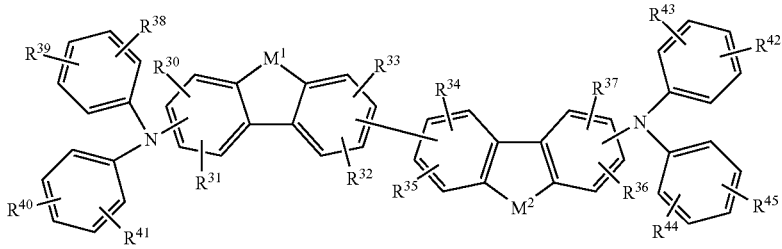

[Chemical Formula 1B-1]

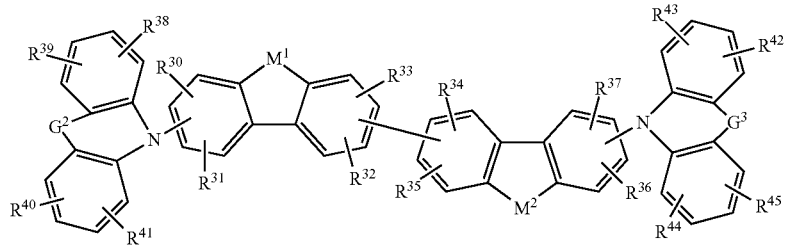

In Chemical Formula 1A-1 or 1B-1, $M^1$, $M^2$, $G^2$, $G^3$, and $R^{30}$ to $R^{37}$ are the same as described above, and each of $R^{38}$ to $R^{45}$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group.

In some example embodiments, the non-absorbing material associated with a visible wavelength spectrum of light may be a compound represented by Chemical Formula 1A-1a or 1B-1a, but is not limited thereto.

configured to reduce heterogeneity on the interface between the photoelectronic conversion layer 30 and the first buffer layer 41 and thus reduce and/or prevent a hindrance of charge movement or loss of charges due to a recombination of the charges on the interface.

The first light absorbing material may include an organic material. The first light absorbing material may be anorganic material having a core structure including an electron donating moiety, a pi-conjugation linker, and an electron accepting moiety as described above.

[Chemical Formula 1A-1a]

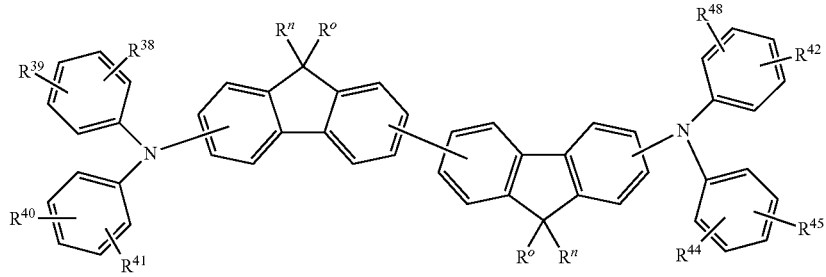

[Chemical Formula 1B-1a]

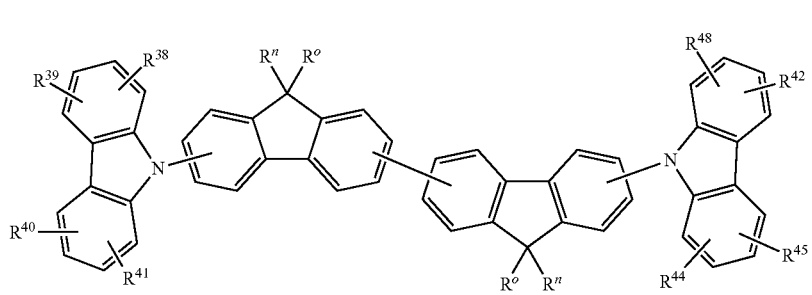

In Chemical Formula 1A-1a or 1B-1a, $R^{38}$ to $R^{45}$ and $R^o$ and $R^n$ are the same as described above.

A thickness of the first buffer layer 41 may range from about 1 nm to about 20 nm.

The second buffer layer 42 may be in contact with the photoelectronic conversion layer 30.

The second buffer layer 42 may commonly include the same material as included in the photoelectronic conversion layer 30, including the first light absorbing material.

The first light absorbing material may include a p-type semiconductor or an n-type semiconductor, for example a p-type semiconductor. The first light absorbing material may selectively absorb one of a green wavelength spectrum of light, a blue wavelength spectrum of light, and a red wavelength spectrum of light, for example a green wavelength spectrum of light having a maximum absorption wavelength ($\lambda_{max}$) of about 520 nm to about 580 nm. The first light absorbing material may be, for example an organic material having an energy bandgap of about 1.7 eV to about 2.3 eV, about 1.8 eV to about 2.2 eV, or about 1.9 eV to about 2.1 eV.

The second buffer layer 42 may commonly include the same first light absorbing material as included in the photoelectronic conversion layer 30 and accordingly may be The first light absorbing material may be, for example a compound represented by Chemical Formula 2.

[Chemical Formula 2]

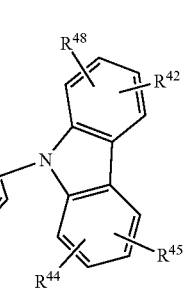

In Chemical Formula 2,

X is Se, Te, SO, $SO_2$, or $SiR^aR^b$,

EDG is an electron donating group,

EAG is an electron accepting group, and each of $R^1$, $R^2$, $R^a$, and $R^b$ are independently hydrogen or a monovalent substituent.

The first light absorbing material may be, for example a compound represented by Chemical Formula 2A or 2B.

[Chemical Formula 2A]

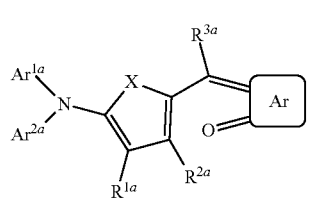

[Chemical Formula 2B]

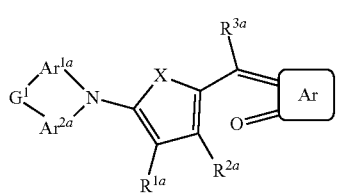

In Chemical Formula 2A or 2B,

X is Se, Te, SO, $SO_2$, or $SiR^aR^b$,

Ar is a substituted or unsubstituted 5-membered ring, a substituted or unsubstituted 6-membered ring, or a fused ring of two or more rings, each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group, $Ar^{1a}$ and $Ar^{2a}$ are independently present or are linked to each other to provide a ring, $G^1$ is selected from a single bond, $-(CR^gR^h)_{n2}-$, $-O-$, $-S-$, $-Se-$, $-N=$, $-NR^i-$, $-SiR^jR^k-$, and $-GeR^lR^m-$, wherein n2 is 1 or 2, each of $R^{1a}$ to $R^{3a}$, $R^a$, and $R^b$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group.

The first light absorbing material may be, for example a compound represented by one of Chemical Formulae 2A-1 to 2A-4.

[Chemical Formula 2A-1]

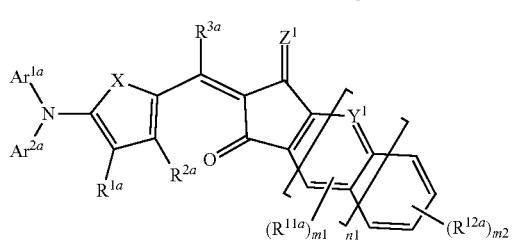

[Chemical Formula 2A-2]

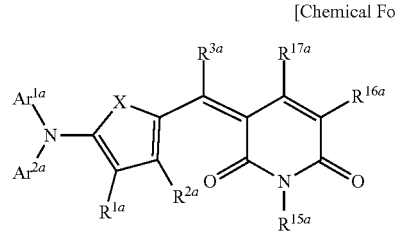

[Chemical Formula 2A-3]

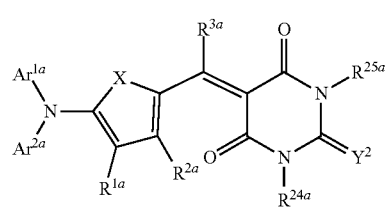

[Chemical Formula 2A-4]

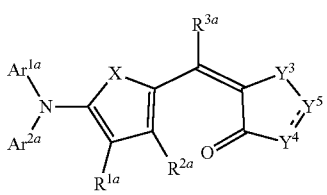

In Chemical Formulae 2A-1 to 2A-4,

X is Se, Te, SO, $SO_2$, or $SiR^aR^b$, $Z^1$ is O or $CR^cR^d$, $Y^1$ is N or $CR^e$, $Y^2$ is selected from O, S, Se, Te, and $C(R^f)(CN)$, $Y^3$ is O, S, Se, or Te, $Y^4$ is N or $NR^{18a}$, $Y^5$ is $CR^{19a}$ or $C=CR^{20a}(CN)$, each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group, each of $R^{1a}$ to $R^{3a}$, $R^{11a}$, $R^{12a}$, $R^{15a}$ to $R^{20a}$, $R^{24a}$, $R^{25a}$, and $R^a$ to $R^f$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group, n1 is 0 or 1, m1 is 0 or 1, and m2 is an integer that is inclusively between 0 and 4.

The compound represented by one of Chemical Formulae 2A-1 to 2A-4 may be, for example compounds of Group 1, but is not limited thereto.

[Group 1]
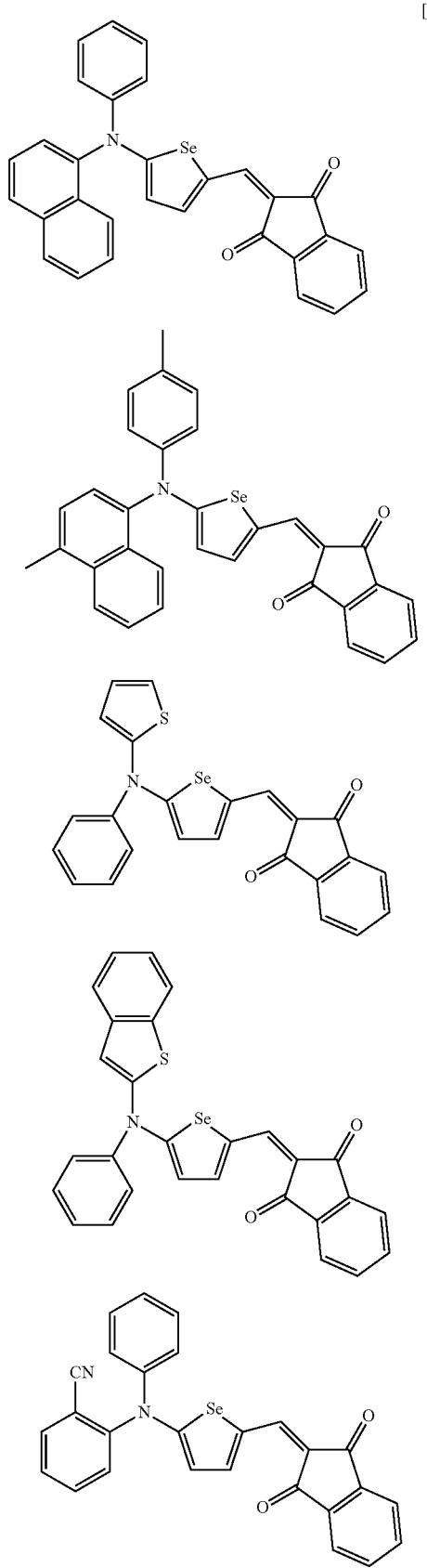
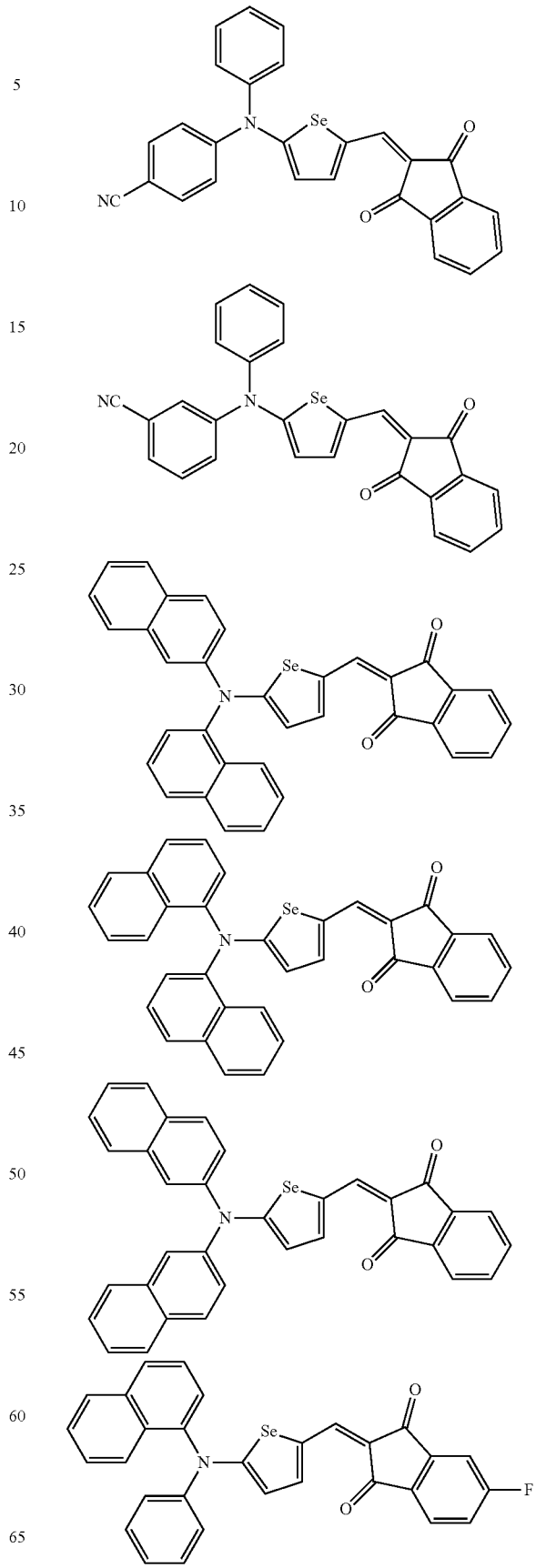

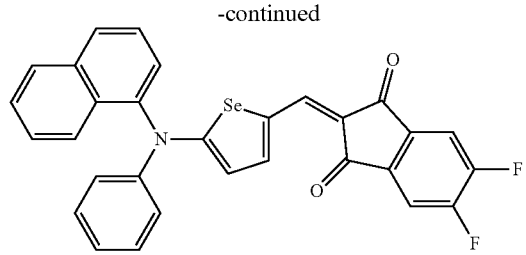
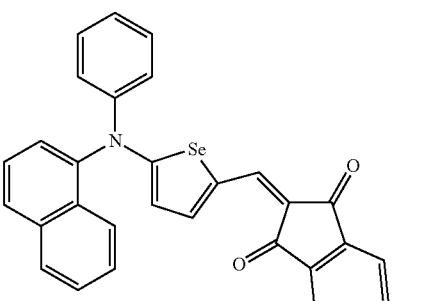
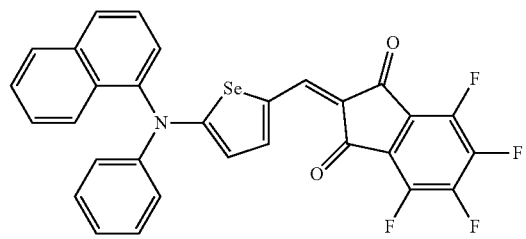
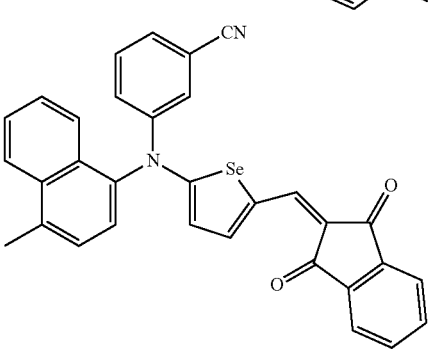
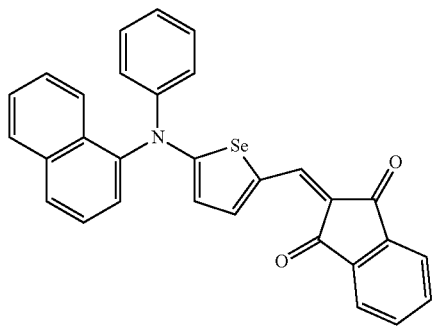
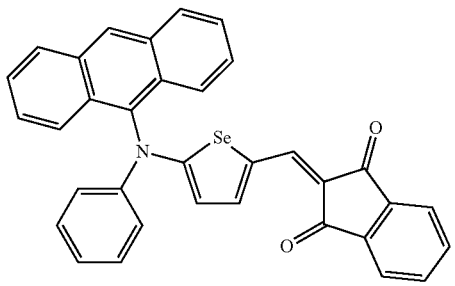
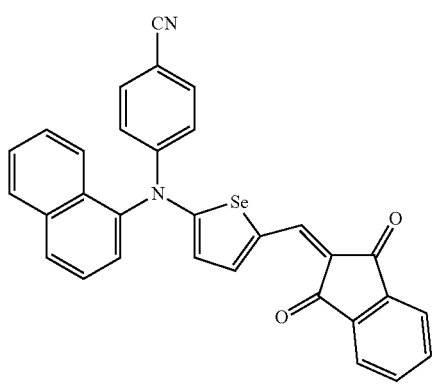
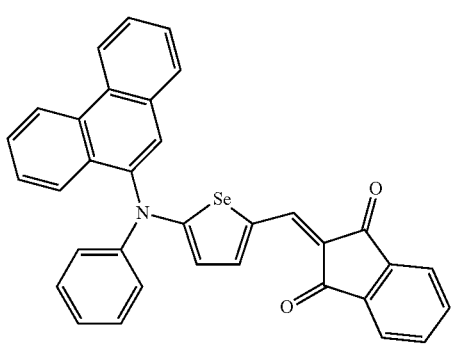
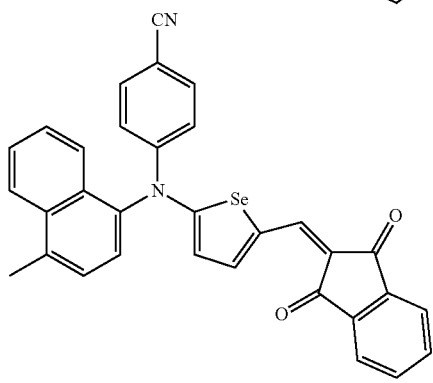
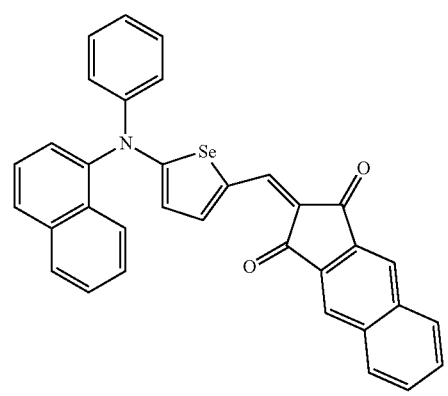

25
-continued
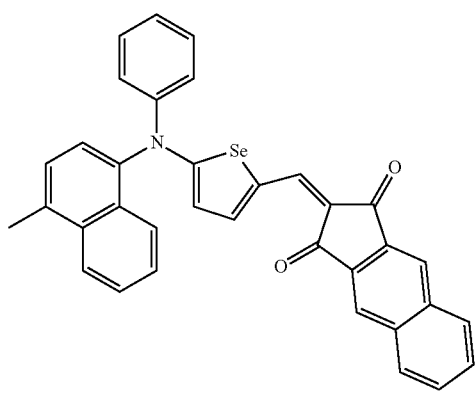
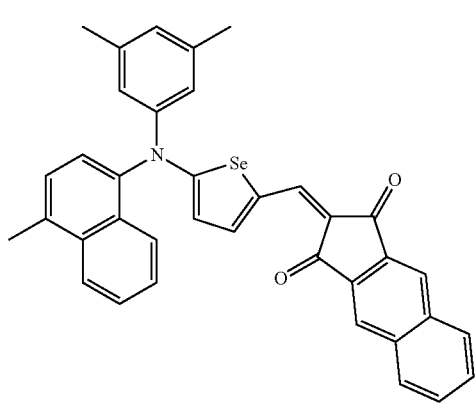
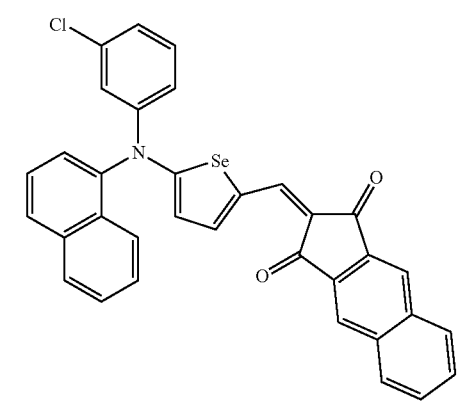
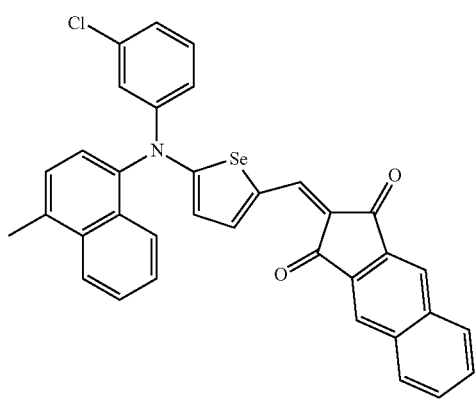
26
-continued
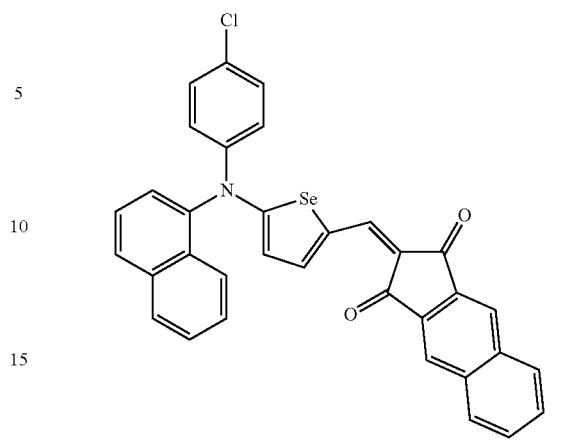
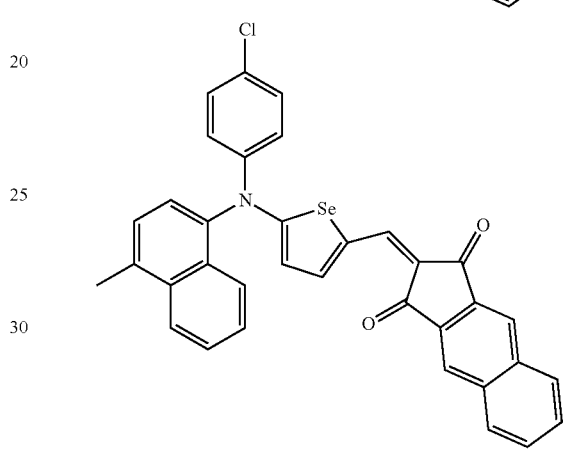
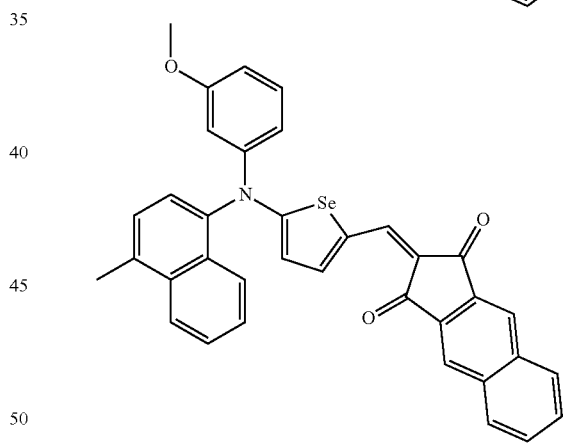
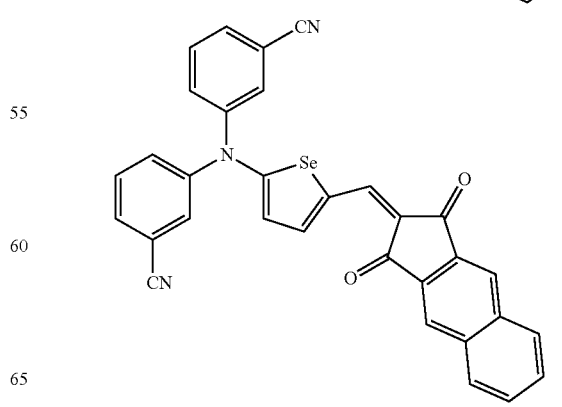

-continued
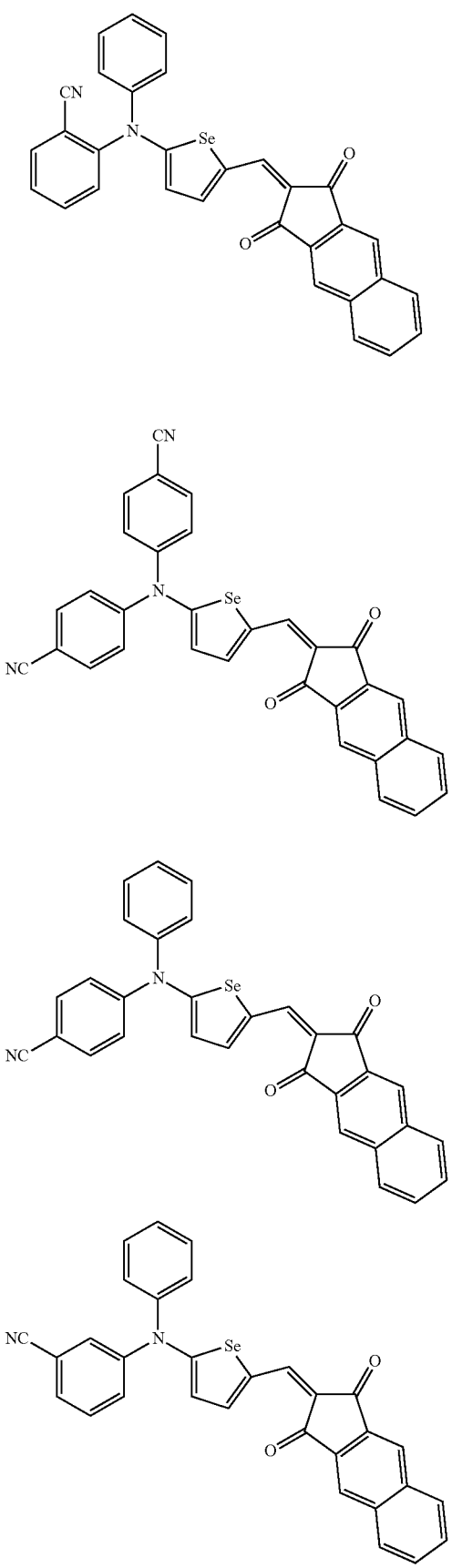
-continued
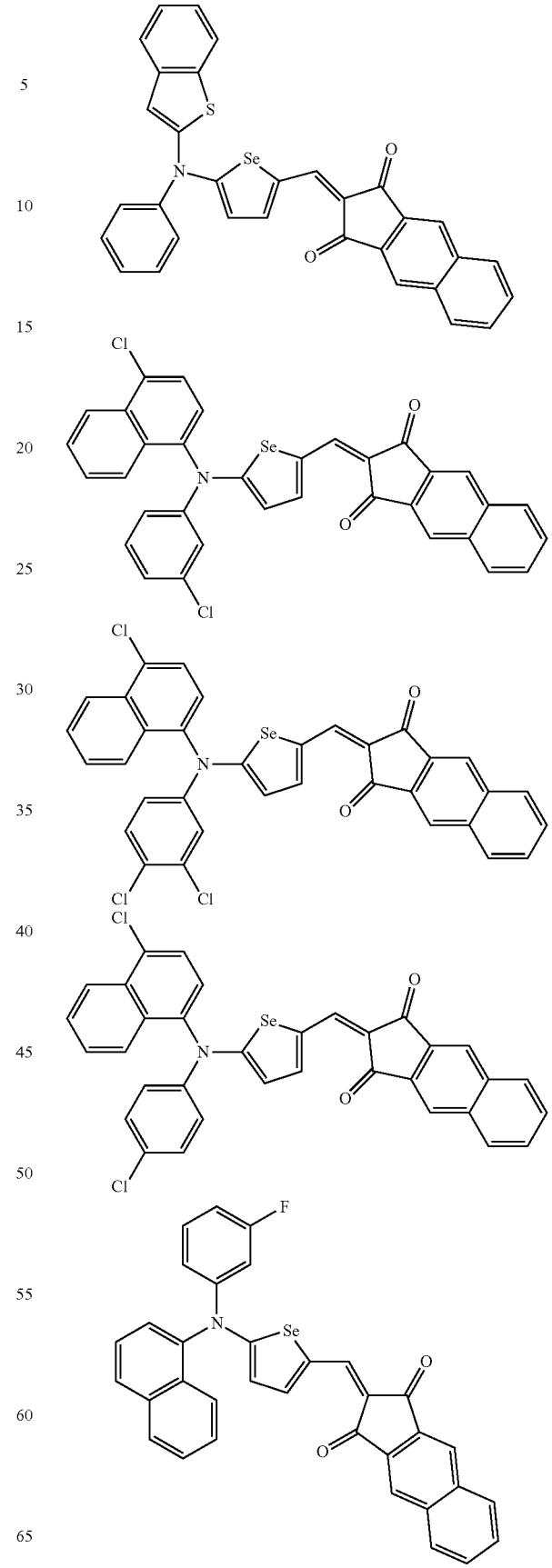

29
-continued
30
-continued
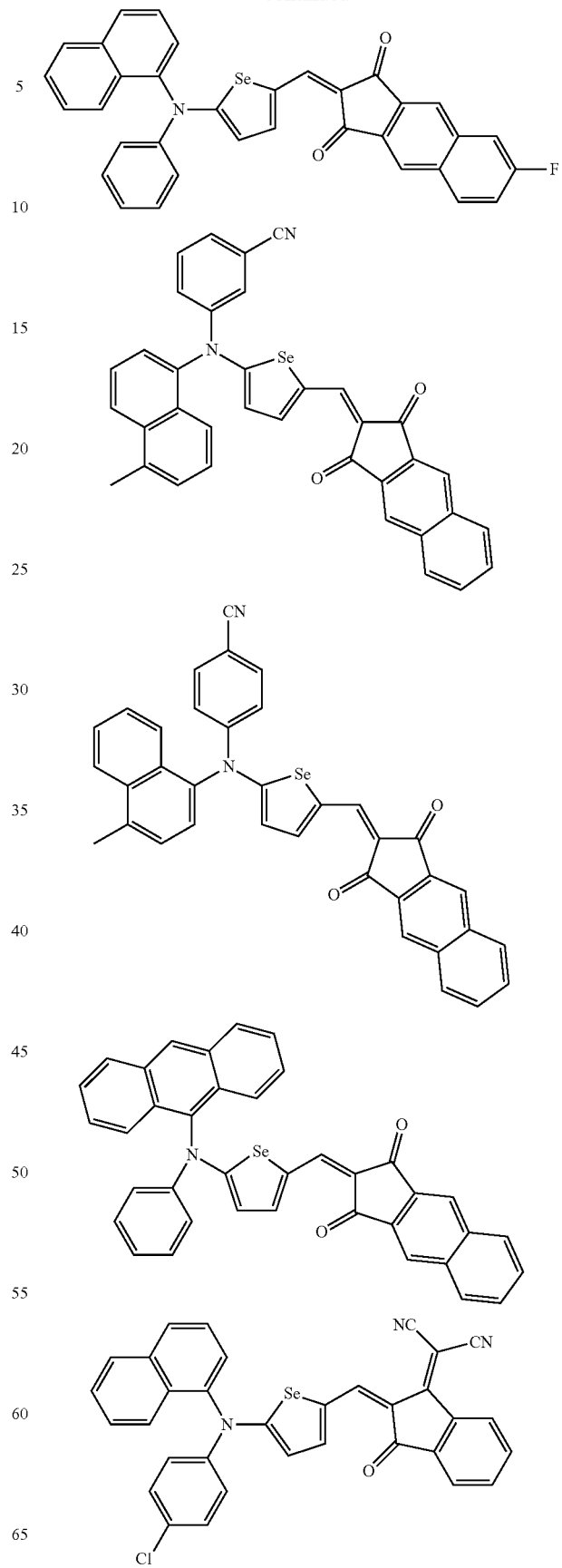

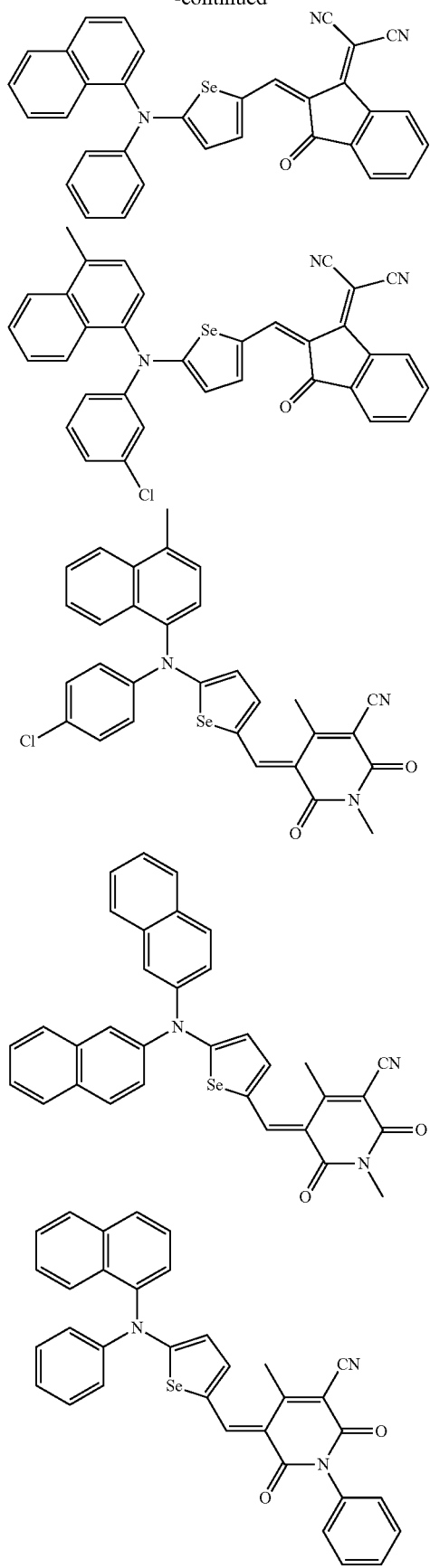
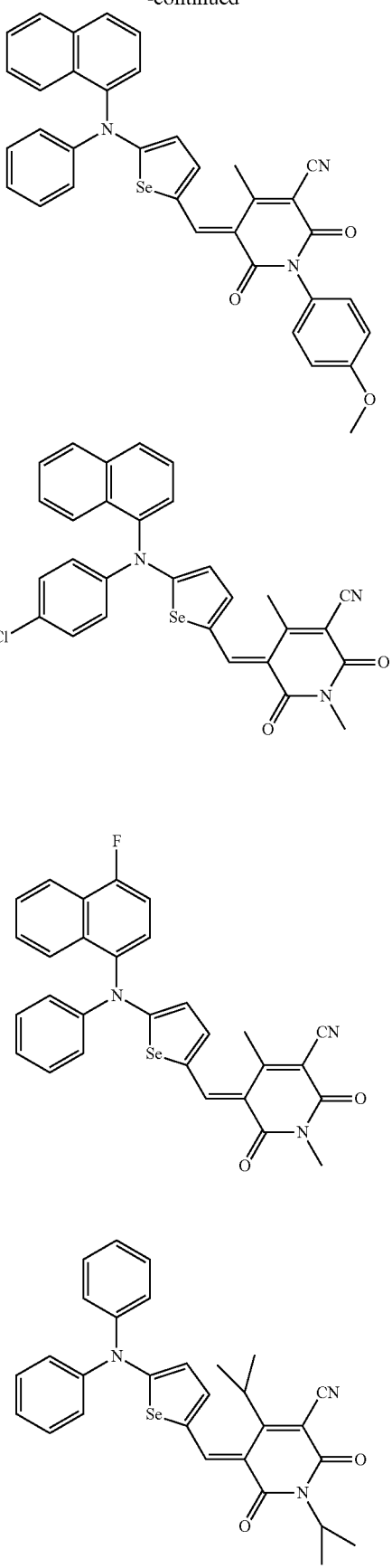

-continued

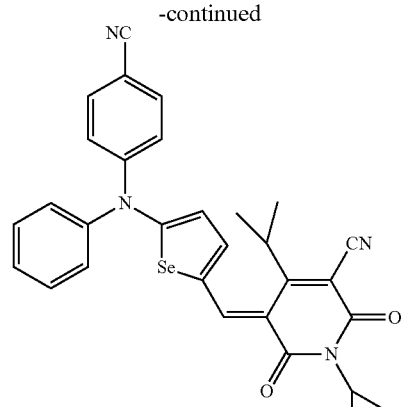

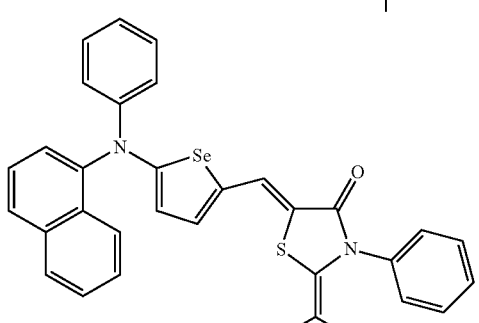

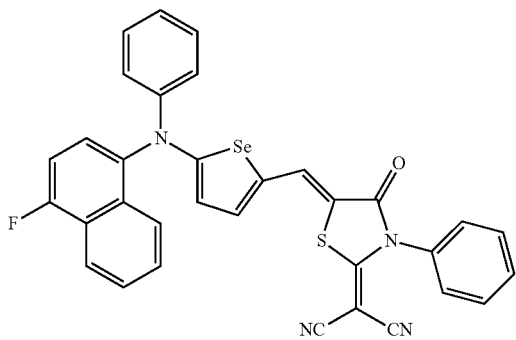

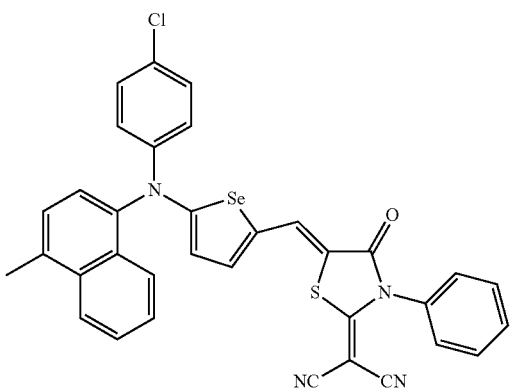

The first sight absorbing material may include, for example a compound represented by one of Chemical Formulae 2B-1 to 2B-4.

[Chemical Formula 2B-1]

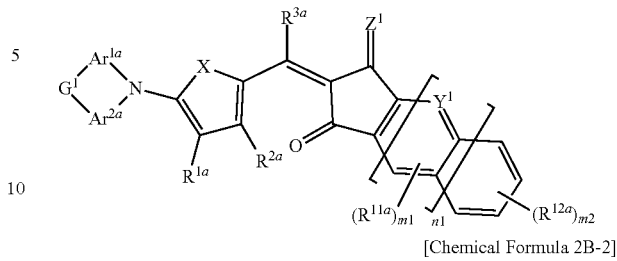

[Chemical Formula 2B-2]

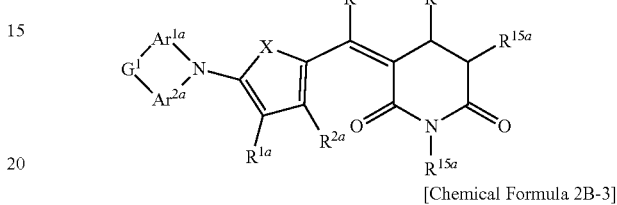

[Chemical Formula 2B-3]

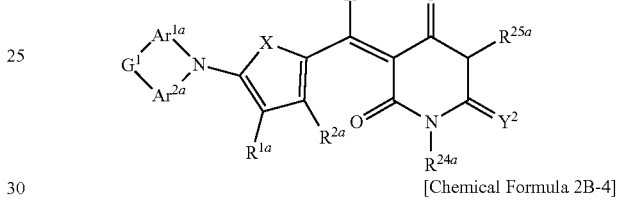

[Chemical Formula 2B-4]

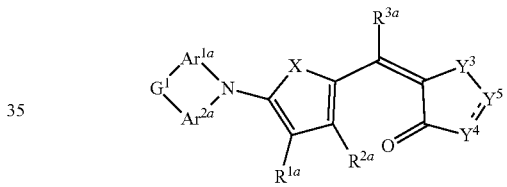

In Chemical Formulae 2B-1 to 2B-4,

X is Se, Te, SO, $SO_2$, or $SiR^aR^b$, $Z^1$ is O or $CR^cR^d$, $Y^1$ is N or $CR^e$, $Y^2$ is selected from O, S, Se, Te, and $C(R^f)(CN)$, $Y^3$ is O, S, Se, or Te, $Y^4$ is N or $NR^{18a}$, $Y^5$ is $CR^{19a}$ or $C=CR^{20a}(CN)$, $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group, $G^1$ is selected from a single bond, $—(CR^gR^h)_{n2}—$, —O—, —S—, —Se—, —N=, $—NR^i—$, $—SiR^jR^k—$, and $—GeR^lR^m—$, wherein n2 is 1 or 2, $R^{1a}$ to $R^{3a}$, $R^{11a}$, $R^{12a}$, $R^{15a}$ to $R^{20a}$, $R^{24a}$, $R^{25a}$, and $R^a$ to $R^m$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group, n1 is 0 or 1, n2 is 0, 1, or 2, m1 is 0 or 1, and m2 is an integer that is inclusively between 0 and 4.

The compound represented by one of Chemical Formulae 2B-1 to 2B-4 may be, for example compounds of Group 2, but is not limited thereto.

[Group 2]
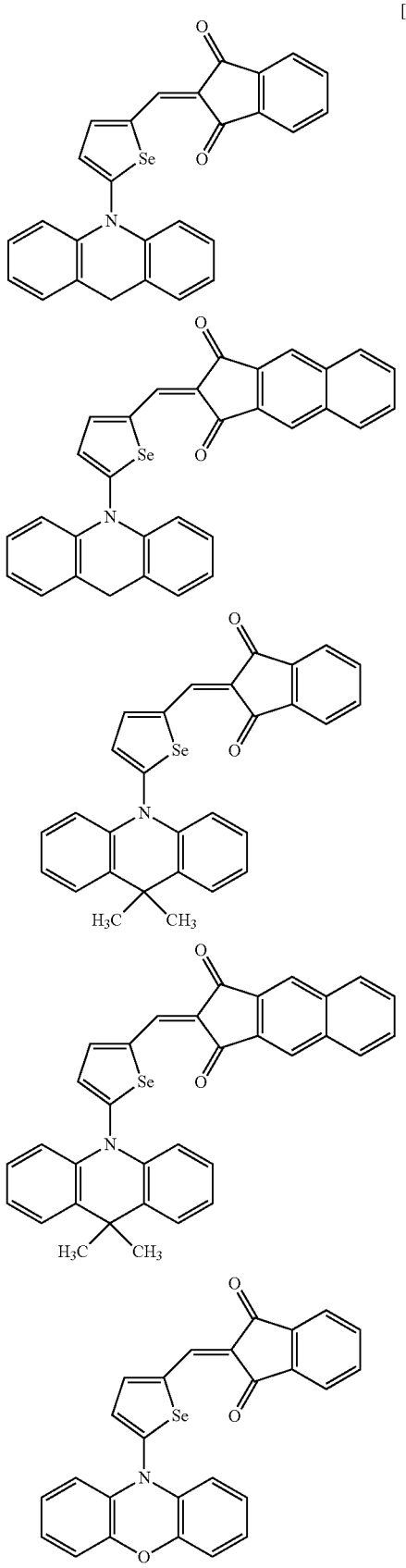
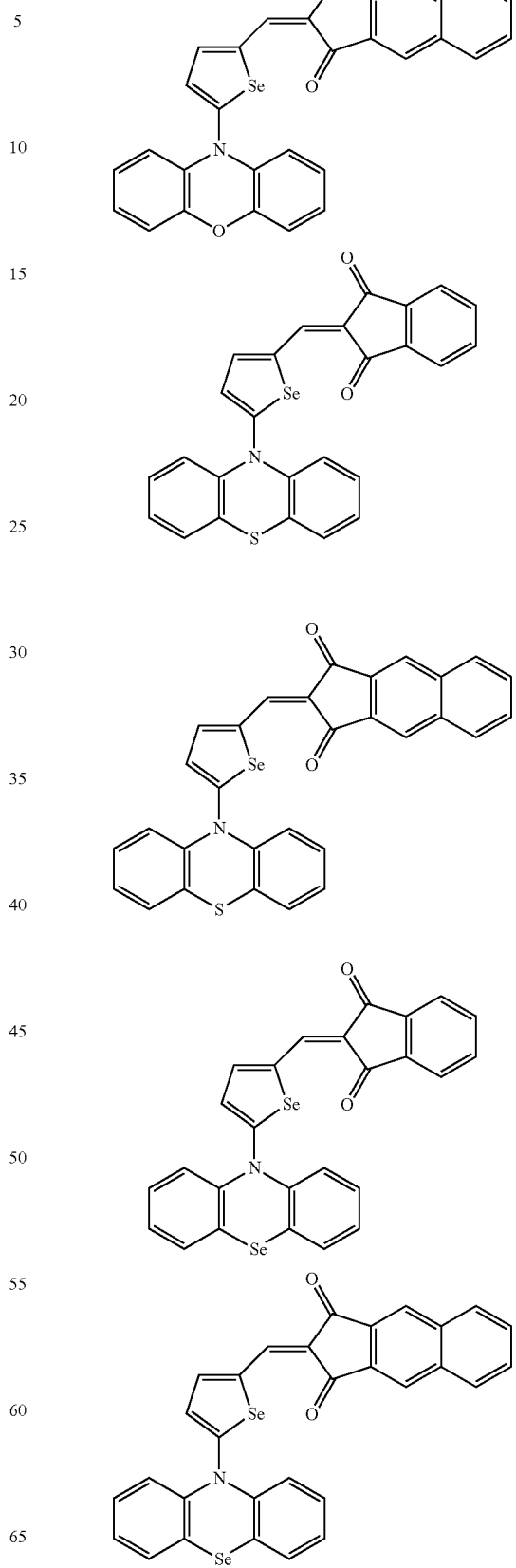

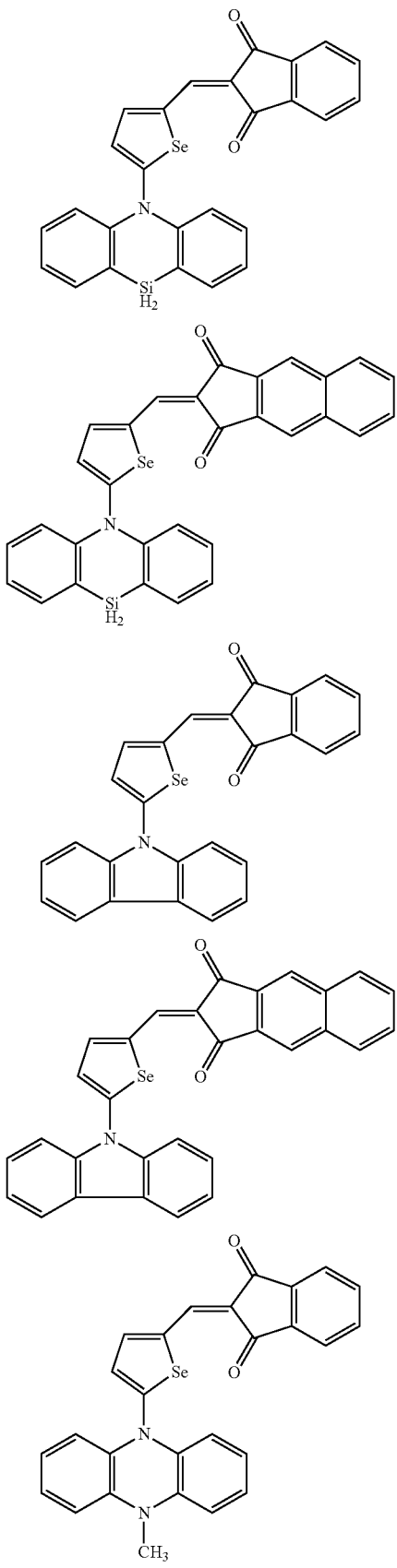
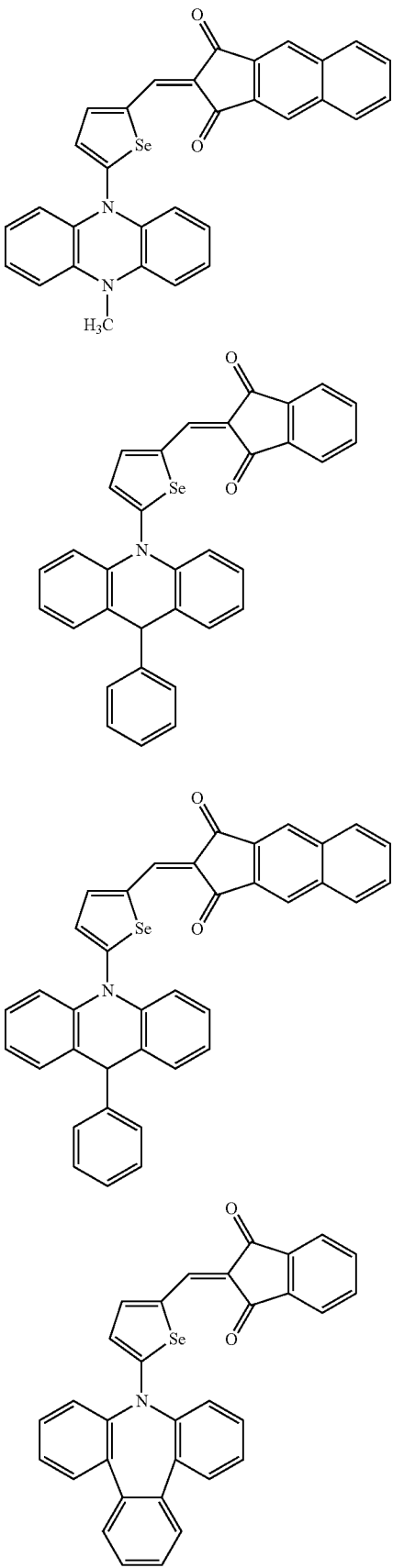

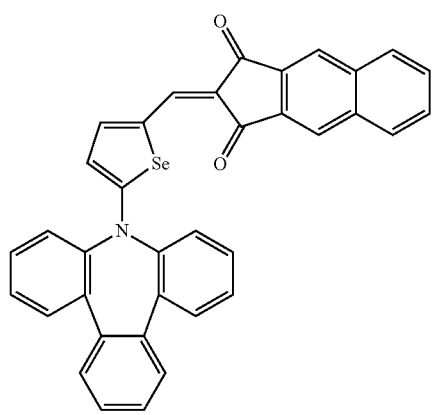
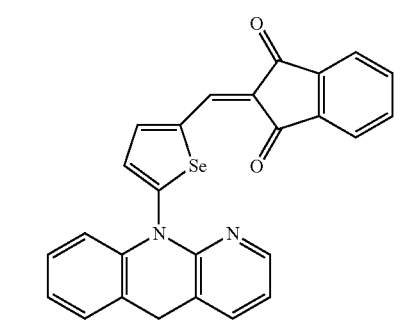
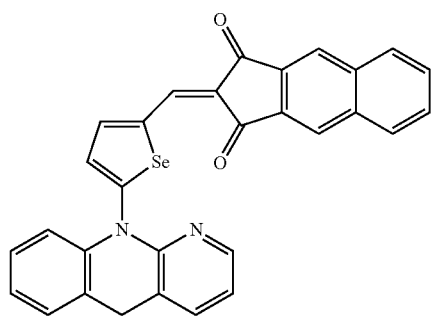
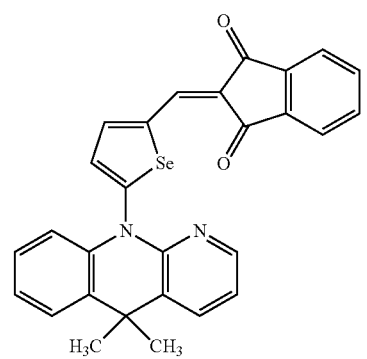
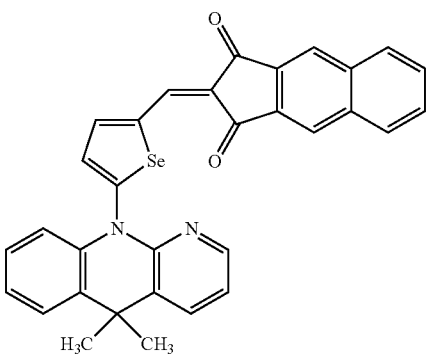
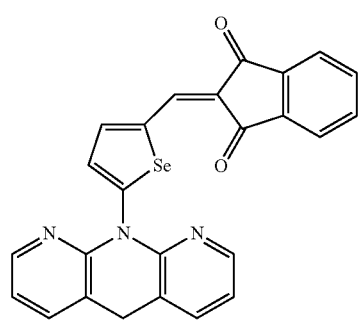
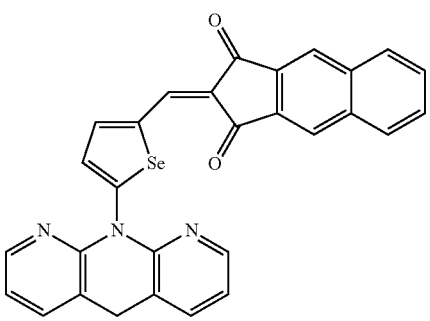
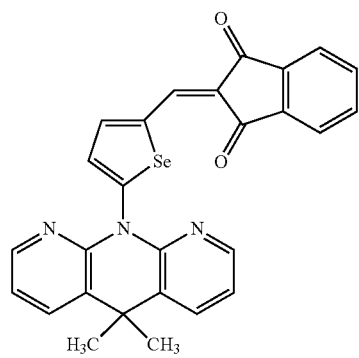
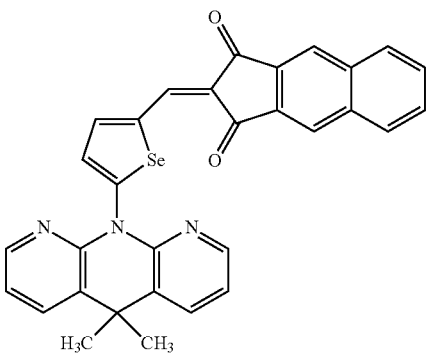

-continued
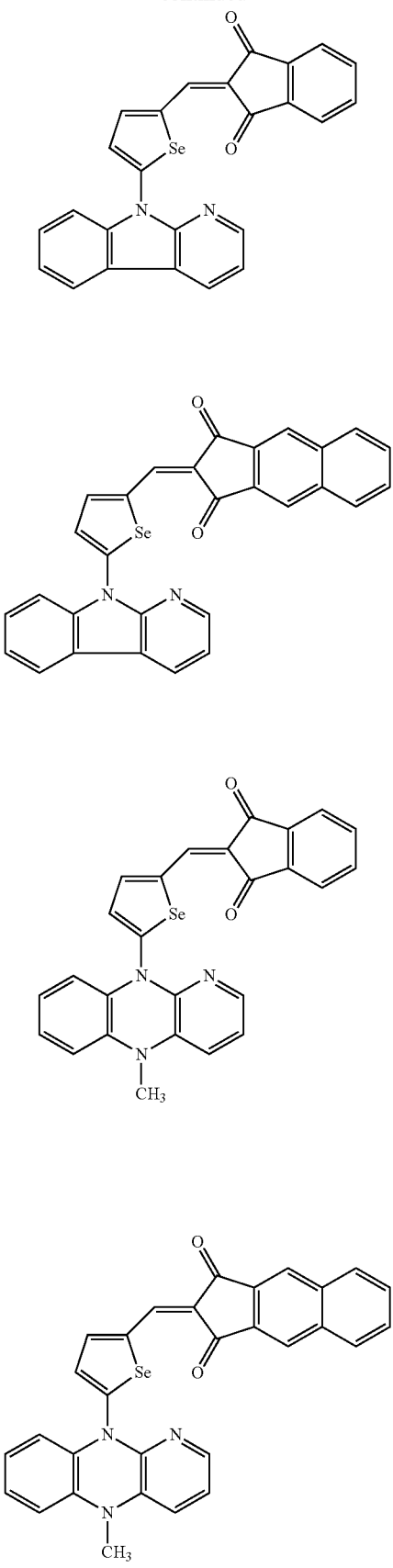
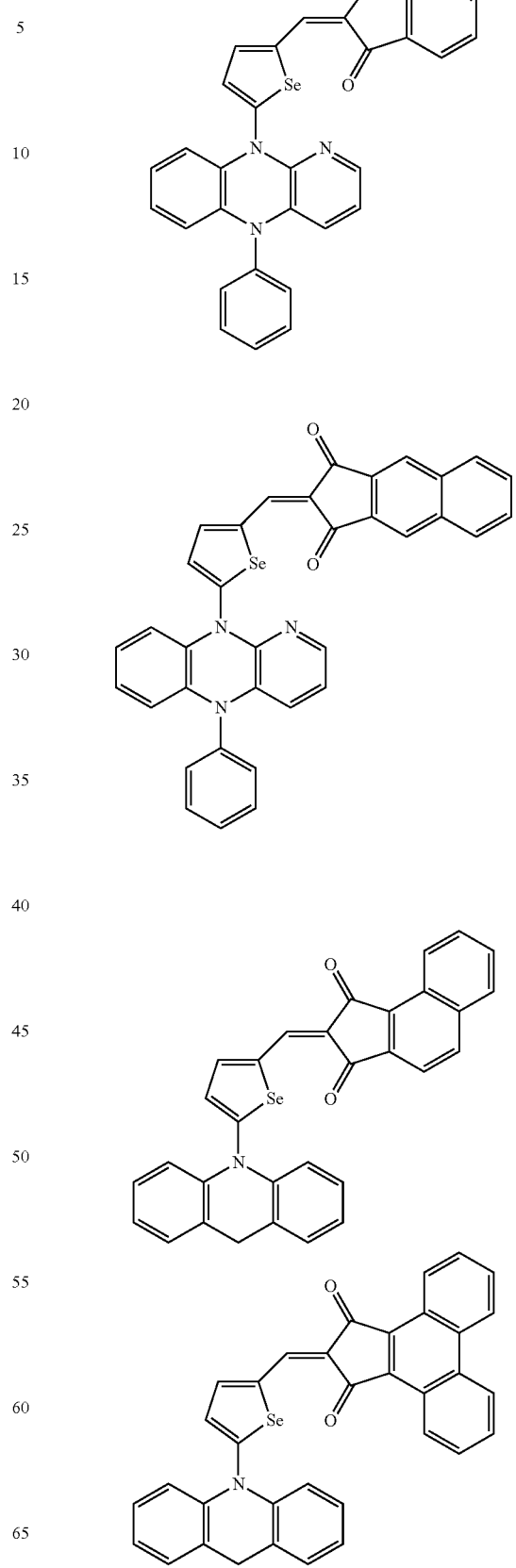

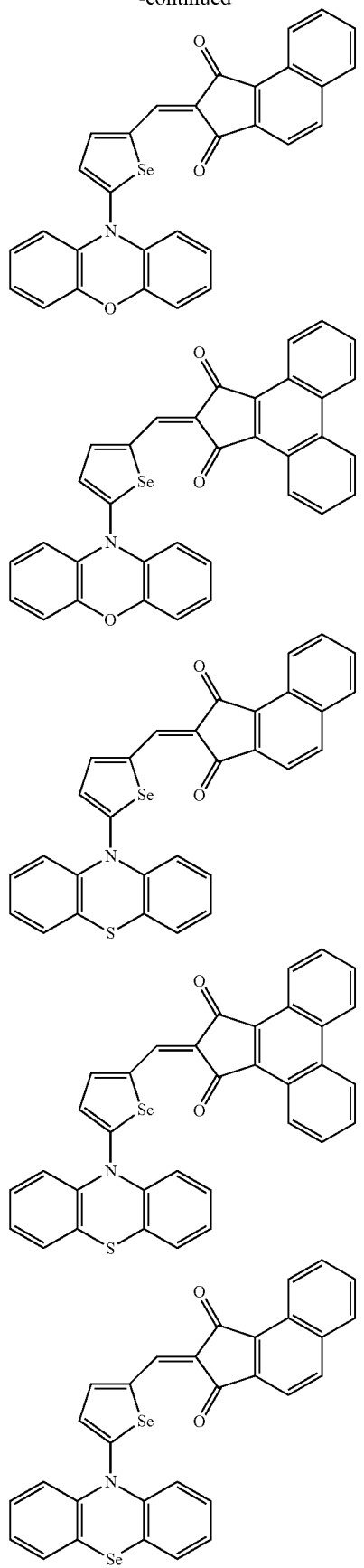
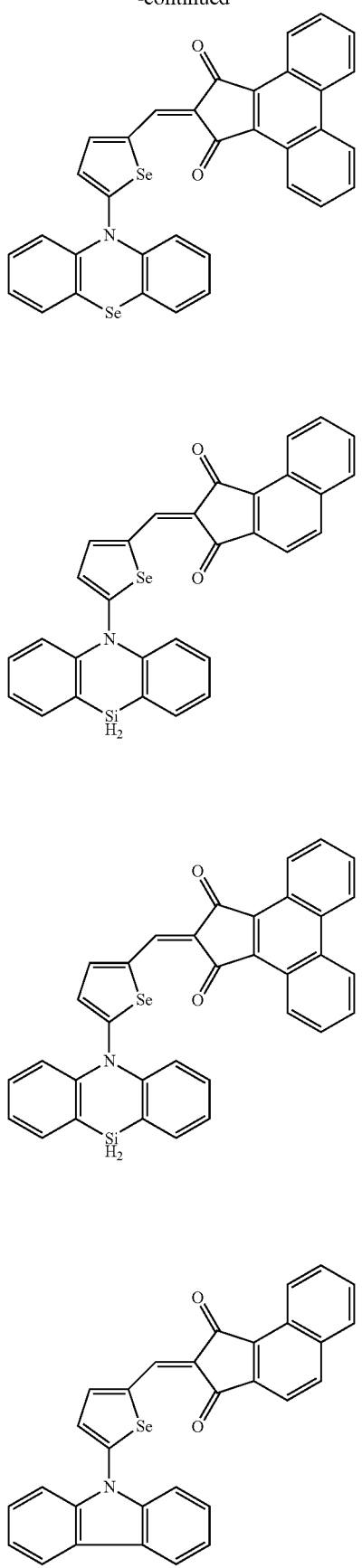

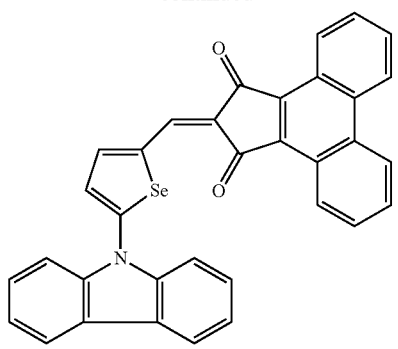
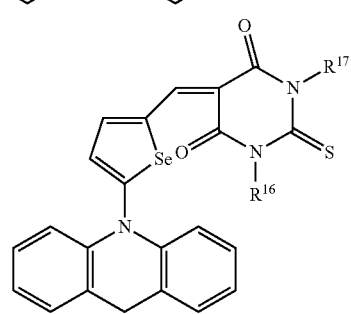
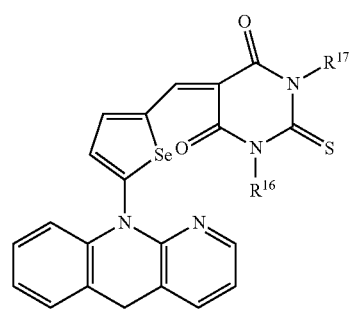
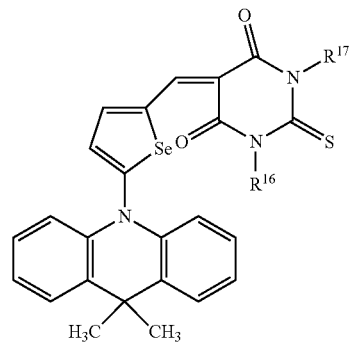
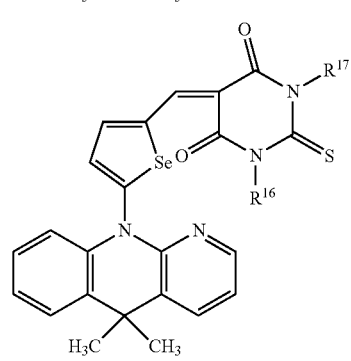
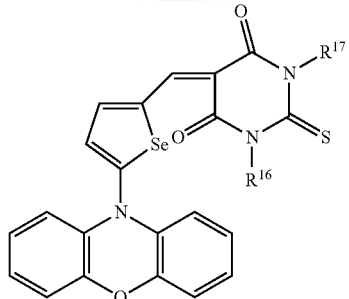
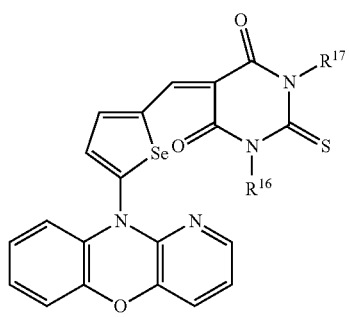
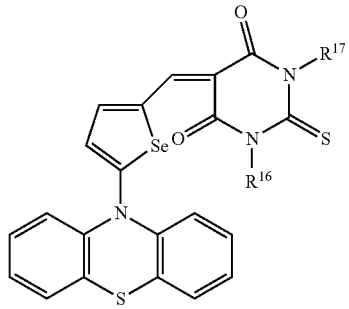
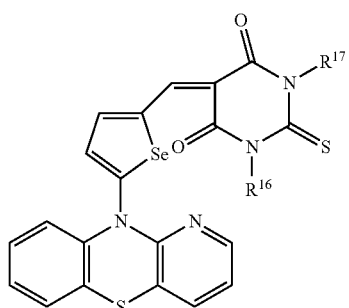
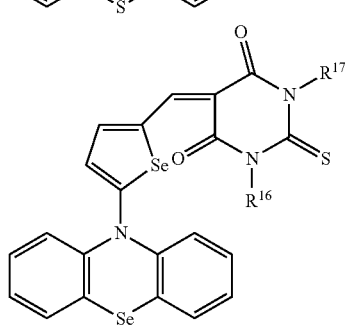

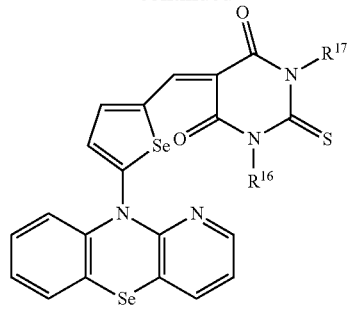
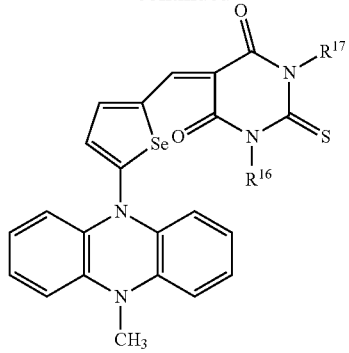
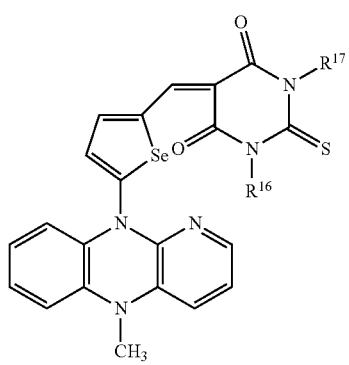
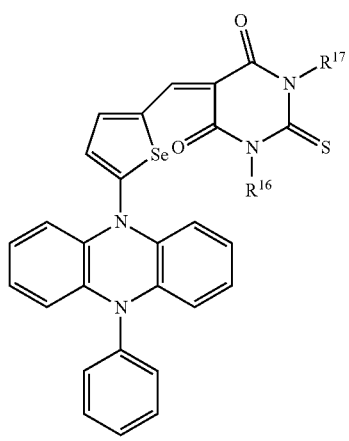
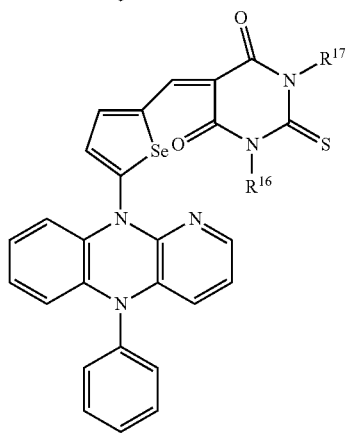

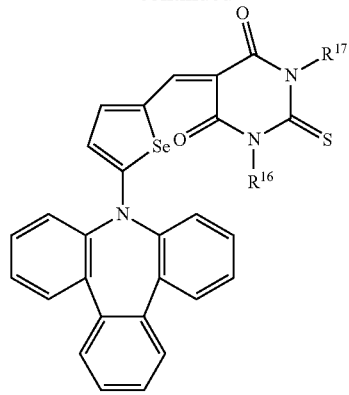
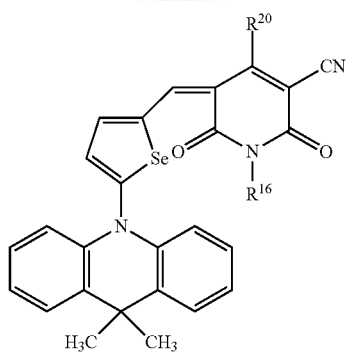

51
-continued
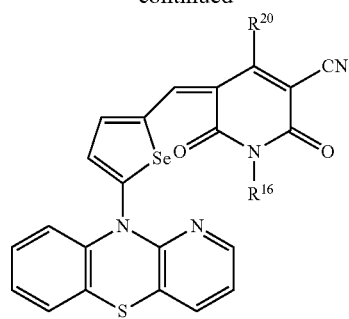
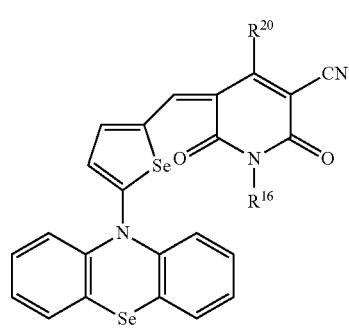
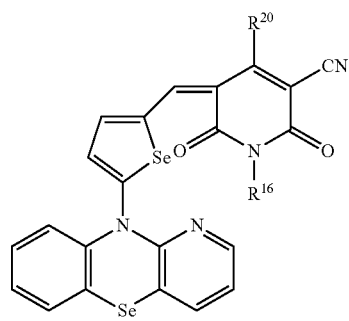
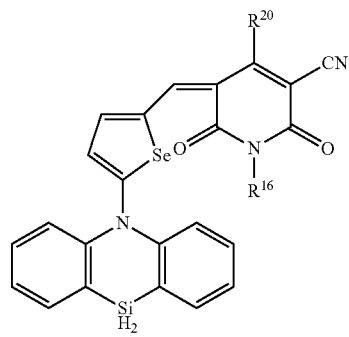
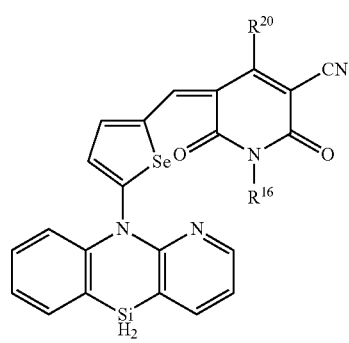
52
-continued
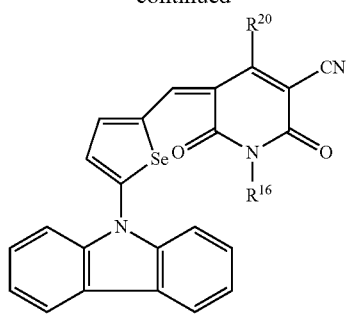
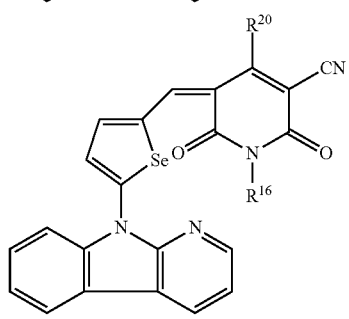
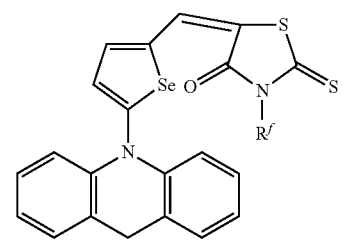
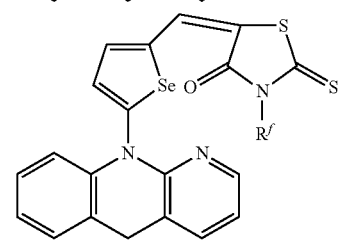
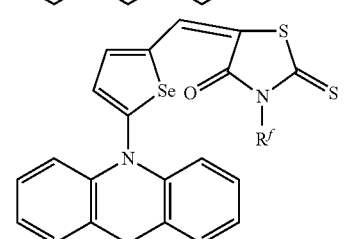
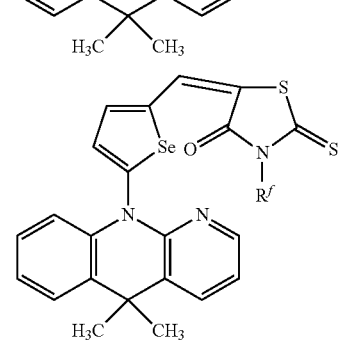

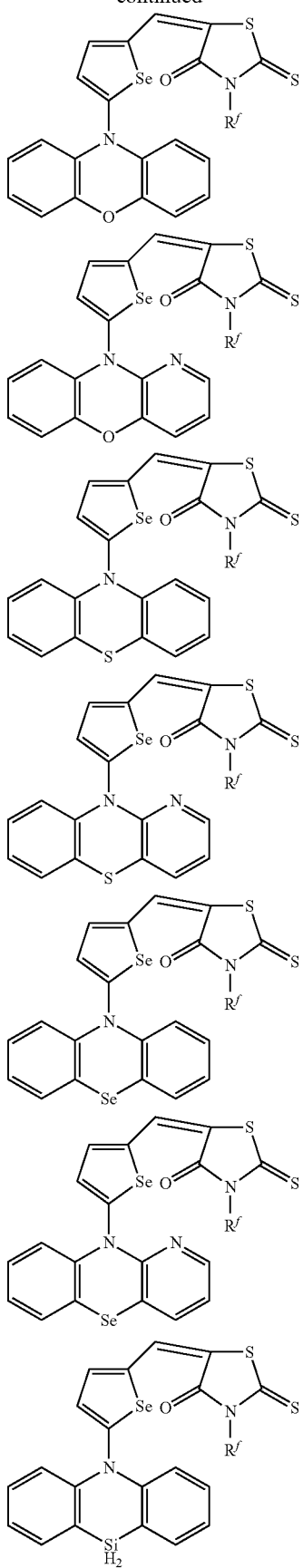

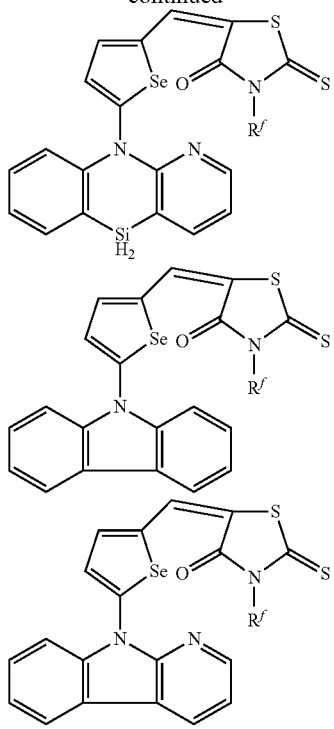

In Group 2, hydrogen of each aromatic ring may be replaced by a substituent selected from a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_4$ to $C_{30}$ heteroaryl group, a halogen, a cyano group, a cyano-containing group, and a combination thereof, and each of $R^{16}$, $R^{17}$, $R^{18}$, $R^{20}$, and $R^f$ are independently hydrogen, a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_4$ to $C_{30}$ heteroaryl group, a halogen, a cyano group, a cyano-containing group, or a combination thereof.

A thickness of the second buffer layer 42 may range from about 1 nm to about 20 nm.

The organic photoelectronic device 100 may further include an anti-reflection layer (not shown) on one side of the first electrode 10 or the second electrode 20.

The anti-reflection layer is disposed on a light incidence side, decreases reflectance of incident light, and improves light absorbance. In some example embodiments, when light enters through the first electrode 10, the anti-reflection layer may be disposed on one side of the first electrode 10, while when light enters at the second electrode 20, the anti-reflection layer may be disposed on one side of the second electrode 20.

The anti-reflection layer may include, for example, a material having a refractive index of about 1.6 to about 2.5, for example, at least one of a metal oxide, a metal sulfide, and an organic material that have a refractive index within the range. The anti-reflection layer may include, for example, a metal oxide including an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof, a metal sulfide including a zinc sulfide, or an organic material including an amine derivative, but is not limited thereto.

In this way, the first buffer layer 41 including a charge buffer material is included between the first electrode 10 and the photoelectronic conversion layer 30 and thus may improve charge mobility, and in addition, the second buffer layer 42 including the same material as included photoelectronic conversion layer 30 is further included between the photoelectronic conversion layer 30 and the first buffer layer 41 and thus may reduce heterogeneity on the interface between the photoelectronic conversion layer 30 and the first buffer layer 41 and prevent and/or reduce hindrance of charge movement or charge loss due to a recombination of charges on the interface. Accordingly, efficiency of an organic photoelectronic device may be improved, but its driving voltage and leakage current may be lowered.

Figure 2:
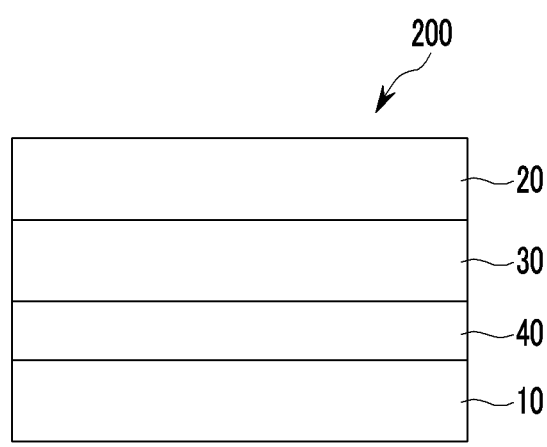
FIG. 2 is a cross-sectional view showing an organic photoelectronic device according to some example embodiments.

FIG. 2 is a cross-sectional view showing an organic photoelectronic device according to some example embodiments.

Referring to FIG. 2, an organic photoelectronic device 200 according to some example embodiments includes a first electrode 10 and a second electrode 20 facing each other, a photoelectronic conversion layer 30 between the first electrode 10 and the second electrode 20, and a buffer layer 40 between the first electrode 10 and the photoelectronic conversion layer 30, like the above embodiment. As described above, the photoelectronic conversion layer 30 includes the first light absorbing material and the second light absorbing material.

However, the organic photoelectronic device 200 according to some example embodiments includes a single layer of a buffer layer 40, unlike the above embodiment, and the buffer layer 40 includes a mixture of a non-absorbing material associated with a visible wavelength spectrum of light that is a charge buffer material and the same material as the material of the photoelectronic conversion layer 30.

In some example embodiments, the buffer layer 40 may include a mixture of the non-absorbing material associated with a visible wavelength spectrum of light and the first light absorbing material. For example, the buffer layer 40 may include a mixture of the non-absorbing material associated with a visible wavelength spectrum of light and the first light absorbing material selectively absorbing one of red light, green light, and blue light. In some example embodiments, the buffer layer 40 may include a mixture of the non-absorbing material associated with a visible wavelength spectrum of light and the first light absorbing material selectively absorbing green light having a maximum absorption wavelength ($\lambda_{max}$) in about 520 nm to about 580 nm. For example, the buffer layer 40 may include a mixture of the non-absorbing material associated with a visible wavelength spectrum of light represented by Chemical Formula 1A or 1B and the first light absorbing material represented by Chemical Formula 2. In some example embodiments, the buffer layer 40 may include a mixture of the non-absorbing material associated with a visible wavelength spectrum of light represented by Chemical Formula 1A-1, 1B-1, 1A-1a, or 1B-1a and the first light absorbing material represented by one of Chemical Formulae 2A, 2B, 2A-1 to 2A-4, and 2B-1 to 2B-4.

The buffer layer 40 may include the non-absorbing material associated with a visible wavelength spectrum of light and the first light absorbing material in a composition ratio of about 1:99 to about 99:1, for example about 10:90 to about 90:10, about 20:80 to about 80:20, about 30:70 to about 70:30, about 40:60 to about 60:40, or about 50:50. Herein, the composition ratio may be a volume ratio.

The buffer layer 40 may have a thickness of about 2 nm to about 40 nm.

Figure 3:
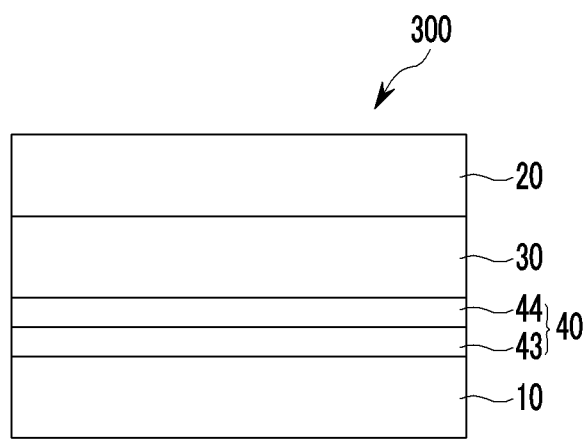
FIG. 3 is a cross-sectional view showing an organic photoelectronic device according to some example embodiments.

FIG. 3 is a cross-sectional view showing an organic photoelectronic device according to some example embodiments.

Referring to FIG. 3, an organic photoelectronic device 300 according to some example embodiments includes a first electrode 10 and a second electrode 20 facing each other, a photoelectronic conversion layer 30 between the first electrode 10 and the second electrode 20, and a buffer layer 40 between the first electrode 10 and the photoelectronic conversion layer 30, like the above embodiment. As described above, the photoelectronic conversion layer 30 includes the first light absorbing material and the second light absorbing material.

However, the buffer layer 40 includes a third buffer layer 43 being adjacent to the first electrode 10 and including the non-absorbing material associated with a visible wavelength spectrum of light and a fourth buffer layer 44 being adjacent to the photoelectronic conversion layer 30 and including a mixture of the first light absorbing material and the non-absorbing material associated with a visible wavelength spectrum of light, unlike the above embodiment.

The third buffer layer 43 may be substantially equivalent (e.g., identical within manufacturing and/or material tolerances) to the first buffer layer 41.

The fourth buffer layer 44 may include a mixture of the non-absorbing material associated with a visible wavelength spectrum of light that is a charge buffer material and the first light absorbing material selectively absorbing one of red light, green light, and blue light. In some example embodiments, the fourth buffer layer 44 may include a mixture of the non-absorbing material associated with a visible wavelength spectrum of light that is a charge buffer material and the first light absorbing material selectively absorbing green light having a maximum absorption wavelength ($\lambda_{max}$) in about 520 nm to about 580 nm. For example, the fourth buffer layer 44 may include a mixture of the non-absorbing material associated with a visible wavelength spectrum of light represented by Chemical Formula 1A or 1B and the first light absorbing material represented by Chemical Formula 2. In some example embodiments, the fourth buffer layer 44 may include a mixture of the non-absorbing material associated with a visible wavelength spectrum of light represented by Chemical Formula 1A-1, 1B-1, 1A-1a, or 1B-1a and the first light absorbing material represented by one of Chemical Formulae 2A, 2B, 2A-1 to 2A-4, and 2B-1 to 2B-4.

The buffer layer 40 may have a thickness of about 2 nm to about 40 nm. For example, the third buffer layer 43 may have a thickness of about 1 nm to about 20 nm and the fourth buffer layer 44 may have a thickness of about 1 nm to about 20 nm.

Figure 4:
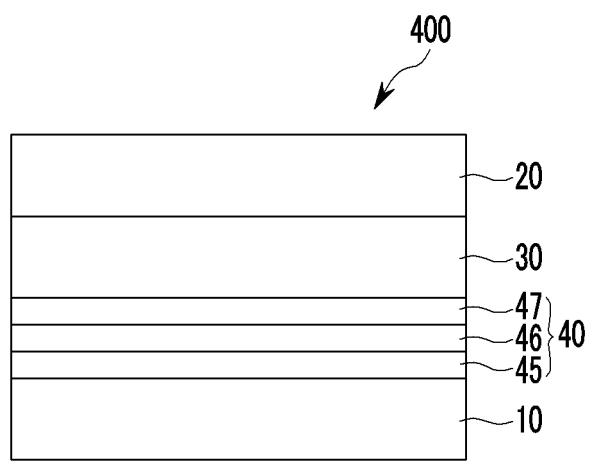
FIG. 4 is a cross-sectional view showing an organic photoelectronic device according to some example embodiments.

FIG. 4 is a cross-sectional view showing an organic photoelectronic device according to some example embodiments.

Referring to FIG. 4, an organic photoelectronic device 400 according to some example embodiments includes a first electrode 10 and a second electrode 20 facing each other, a photoelectronic conversion layer 30 between the first electrode 10 and the second electrode 20, and a buffer layer 40 between the first electrode 10 and the photoelectronic conversion layer 30, like the above embodiment. As described above, the photoelectronic conversion layer 30 includes the first light absorbing material and the second light absorbing material.

In some example embodiments, the buffer layer 40 includes a fifth buffer layer 45 that is adjacent to the first electrode 10 and includes the non-absorbing material associated with a visible wavelength spectrum of light, a sixth buffer layer 47 that is adjacent to the photoelectronic conversion layer 30 and including the first light absorbing material, and a seventh buffer layer 46 between the fifth buffer layer 45 and the sixth buffer layer 47 and that includes a mixture of the first light absorbing material and the non-absorbing material associated with a visible wavelength spectrum of light.

The fifth buffer layer 45 may be substantially equivalent to the first buffer layer 41.

The sixth buffer layer 47 may be substantially equivalent to the second buffer layer 42.

The seventh buffer layer 46 may include a mixture of the non-absorbing material associated with a visible wavelength spectrum of light that is a charge buffer material and the first light absorbing material configured to selectively absorb one of red light, green light, and blue light. In some example embodiments, the seventh buffer layer 46 may include a mixture of the non-absorbing material associated with a visible wavelength spectrum of light that is a charge buffer material and the first light absorbing material configured to selectively absorb green light having a maximum absorption wavelength ($\lambda_{max}$) of about 520 nm to about 580 nm. In some example embodiments, the seventh buffer layer 46 may include a mixture of the non-absorbing material associated with a visible wavelength spectrum of light represented by Chemical Formula 1A or 1B and the first light absorbing material represented by Chemical Formula 2. In some example embodiments, the seventh buffer layer 46 may include a mixture of the non-absorbing material associated with a visible wavelength spectrum of light represented by Chemical Formula 1A-1, 1B-1, 1A-1a, or 1B-1a and the first light absorbing material represented by one of Chemical Formulae 2A, 2B, 2A-1 to 2A-4, and 2B-1 to 2B-4.

The seventh buffer layer 46 is positioned between the fifth buffer layer 45 and the sixth buffer layer 47 and includes both a non-absorbing material associated with a visible wavelength spectrum of light included in the fifth buffer layer 45 and a first light absorbing material included in the sixth buffer layer 47 and accordingly, may be configured to further reduce heterogeneity on the interface of each layer from the photoelectronic conversion layer 30 to the first electrode 10 and thus more effectively prevent and/or reduce hindrance of charge movement or charge loss due to a recombination of charges. Accordingly, efficiency of an organic photoelectronic device may be improved, and its driving voltage and leakage current may be further effectively lowered.

The organic photoelectronic device may be applied to a solar cell, an image sensor, a photo-detector, a photo-sensor, and an organic light emitting diode (OLED), but is not limited thereto.

The organic photoelectronic device may be, for example, applied to an image sensor.

Hereinafter, an example of an image sensor including the organic photoelectronic device is described referring to drawings. As an example of an image sensor, an organic CMOS image sensor is described.

Figure 5:
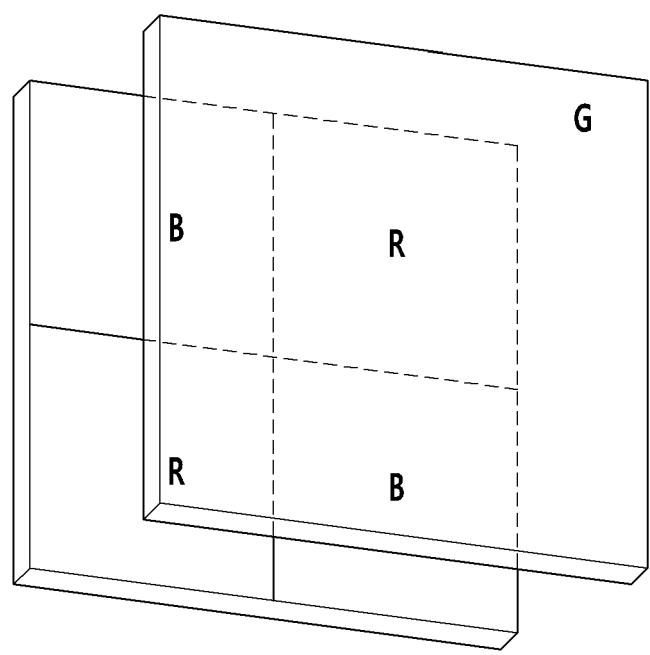
FIG. 5 is a top plan view showing an organic CMOS image sensor according to some example embodiments.
Figure 6:
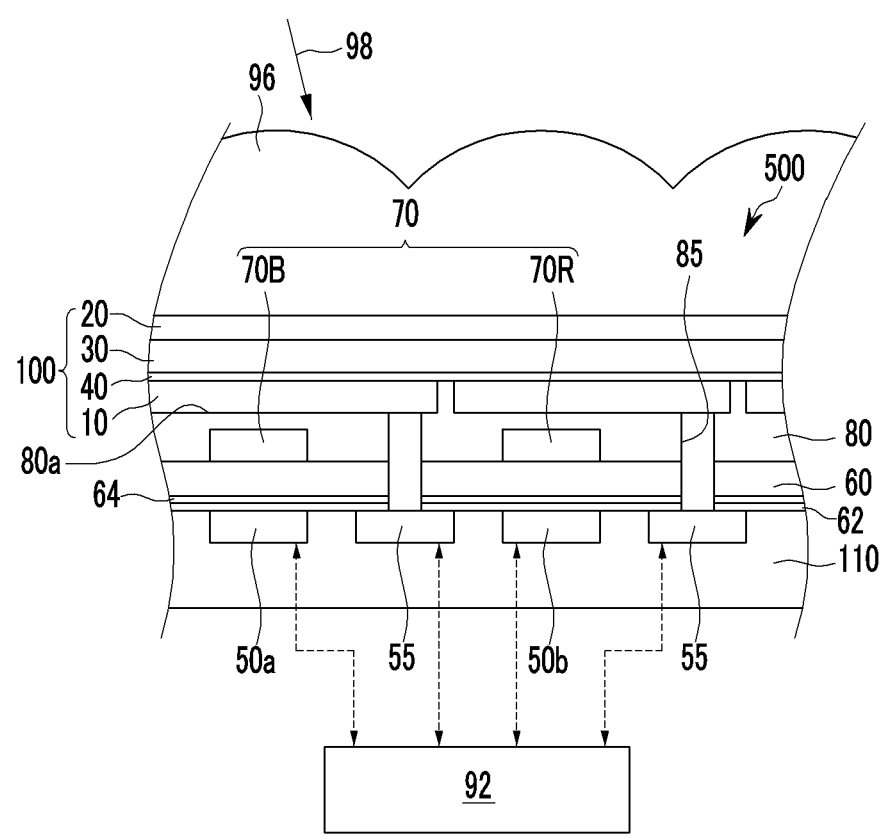
FIG. 6 is a cross-sectional view showing an embodiment of the organic CMOS image sensor of FIG. 5.

FIG. 5 is a top plan view showing an organic CMOS image sensor according to some example embodiments and FIG. 6 is a cross-sectional view showing an embodiment of the organic CMOS image sensor of FIG. 5.

Referring to FIGS. 5 and 6, an organic CMOS image sensor 500 according to some example embodiments includes a semiconductor substrate 110 integrated with photo-sensing devices 50a and 50b, a transmission transistor (not shown) and a charge storage 55, a lower insulation layer 60, a color filter layer 70, an upper insulation layer 80, and an organic photoelectronic device 100.

The semiconductor substrate 110 may be a silicon substrate. The semiconductor substrate 110 is integrated with the photo-sensing devices 50a and 50b, the transmission transistor 92, and the charge storage 55. One or more of the photo-sensing devices 50a and 50b may be a photodiode.

The photo-sensing devices 50a and 50b, the transmission transistor 92, and/or the charge storage 55 may be integrated in each pixel, and as shown in the drawings, the photo-sensing devices 50a and 50b may be included in each blue pixel and red pixel, while the charge storage 55 may be included in a green pixel.

The photo-sensing devices 50a and 50b sense light, the information sensed by the photo-sensing devices may be transferred by the transmission transistor, the charge storage 55 is electrically connected with the organic photoelectronic device 100 that will be described later, and the information of the charge storage 55 may be transferred by the transmission transistor.

A metal wire 62 and a pad 64 are formed on the semiconductor substrate 110. In order to decrease signal delay, the metal wire and pad may at least partially comprise a metal having low resistivity, for example, aluminum (Al), copper (Cu), silver (Ag), and alloys thereof, but is not limited thereto. In some example embodiments, the metal wire 62 and pad 64 may be positioned under the photo-sensing devices 50a and 50b.

The lower insulation layer 60 may be formed on the metal wire 62 and the pad 64. The lower insulation layer 60 may at least partially comprise an inorganic insulating material including a silicon oxide and/or a silicon nitride, or a low dielectric constant (low K) material including SiC, SiCOH, SiCO, and SiOF. The lower insulation layer 60 may include a trench 85 exposing the charge storage 55. The trench 85 may be filled with fillers.

The color filter layer 70 is formed on the lower insulation layer 60. The color filter layer 70 includes a first color filter and a second color filter. In the example embodiments illustrated in FIG. 6, the first color filter is a blue color filter 70B formed in the blue pixel and the second color filter is a red color filter 70R formed in the red pixel. In some example embodiments, one or more of the color filters 70 may be a green color filter 70G.

The upper insulation layer 80 is formed on the color filter layer 70. The upper insulation layer 80 eliminates a step caused by the color filter layer 70 and smoothens the surface 80a. The upper insulation layer 80 and lower insulation layer 60 may include a contact hole (not shown) exposing a pad, and a through-hole 85 exposing the charge storage 55 of a green pixel.

The organic photoelectronic device 100 is formed on the upper insulation layer 80. The organic photoelectronic device 100 includes the first electrode 10, the buffer layer 40, the photoelectronic conversion layer 30, and the second electrode 20 as described above. The first electrode 10, the buffer layer 40, the photoelectronic conversion layer 30, and the second electrode 20 are sequentially stacked in the example embodiments shown in FIG. 6, but the present disclosure is not limited thereto, and the second electrode 20, the photoelectronic conversion layer 30, the buffer layer 40, and the first electrode 10 may be disposed in the order shown in FIG. 6.

The first electrode 10 and the second electrode 20 may be transparent electrodes, and the photoelectronic conversion layer 30 and the buffer layer 40 may be the same as described above with reference to FIGS. 1A-1B and FIG. 2. The photoelectronic conversion layer 30 may selectively absorb light in a green wavelength spectrum of light, and thus replace a color filter of a green pixel.

When light enters from the second electrode 20, the light in a green wavelength spectrum of light may be mainly absorbed in the photoelectronic conversion layer 30 and photoelectrically converted, while the light in a remainder of the wavelength spectra passes through the buffer layer 40 and the first electrode 10 and may be sensed in the photo-sensing devices 50a and 50b.

A focusing lens 96 may be further formed on the organic photoelectronic device 100. The focusing lens 96 may control a direction of incident light 98 and gather the light in one region. The focusing lens 96 may have a shape of, for example, a cylinder or a hemisphere, but is not limited thereto.

As described above, the organic photoelectronic device 100 has a stacked structure and thus may reduce the size of an image sensor and realize a down-sized image sensor.

In FIG. 6, the organic photoelectronic device of FIG. 1A has a stacked structure, but the organic photoelectronic devices of FIGS. 2 to 4 may be also stacked in the same manner.

In some example embodiments, an organic photoelectronic device configured to selectively absorb light in a green wavelength spectrum of light may be stacked, but the present disclosure is not limited thereto, and may include a structure in which an organic photoelectronic device configured to selectively absorb light in a blue wavelength spectrum of light is stacked and a green photo-sensing device and a red photo-sensing device are integrated in the semiconductor substrate 110, or a structure in which an organic photoelectronic device configured to selectively absorb light in a red wavelength spectrum of light is stacked and a green photo-sensing device and a blue photo-sensing device are integrated in the semiconductor substrate 110.

Figure 7:
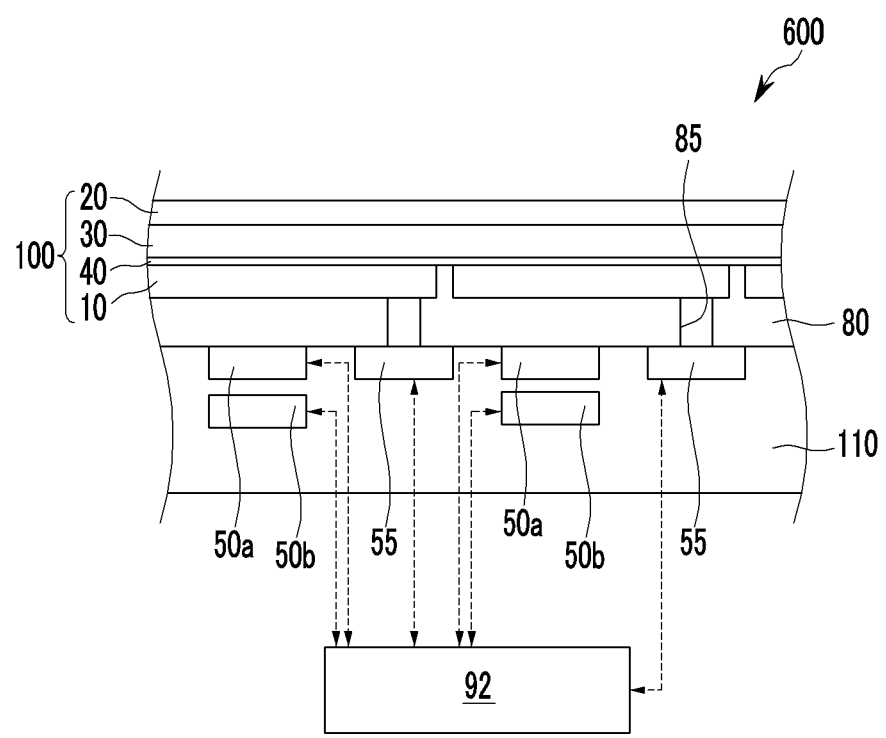
FIG. 7 is a schematic cross-sectional view showing an organic CMOS image sensor according to some example embodiments.

FIG. 7 is a schematic cross-sectional view showing an organic CMOS image sensor according to some example embodiments.

An organic CMOS image sensor 600 according to some example embodiments includes a semiconductor substrate 110 integrated with photo-sensing devices 50a and 50b, a transmission transistor 92, and a charge storage 55, an upper insulation layer 80, and an organic photoelectronic device 100.

However, the organic CMOS image sensor 600 according to some example embodiments includes photo-sensing devices 50a and 50b stacked in a perpendicular direction and does not include a color filter layer 70. The photo-sensing devices 50a and 50b are electrically connected with the charge storage 55, and may be transferred by the transmission transistor. The photo-sensing devices 50a and 50b may selectively absorb light in each wavelength spectrum of light depending on a stack depth.

A focusing lens (not shown) may be further formed on the organic photoelectronic device 100. The focusing lens may control a direction of incident light and gather the light in one region. The focusing lens may have a shape of, for example, a cylinder or a hemisphere, but is not limited thereto.

The organic photoelectronic device configured to selectively absorb light in a green wavelength region is stacked as described above, and the red and blue photo-sensing devices are also stacked, which may reduce the size of an image sensor and realize a down-sized image sensor.

In FIG. 7, the organic photoelectronic device of FIG. 1A is stacked, but the organic photoelectronic devices of FIGS. 2 to 4 may be also stacked in the same manner.

In FIG. 7, an organic photoelectronic device configured to selectively absorb light in a green wavelength spectrum of light is stacked, but the present disclosure is not limited thereto, and may include a structure in which an organic photoelectronic device configured to selectively absorb light in a blue wavelength spectrum of light is stacked and a green photo-sensing device and a red photo-sensing device are integrated in the semiconductor substrate 110, or a structure in which an organic photoelectronic device configured to selectively absorb light in a red wavelength spectrum of light is stacked and a green photo-sensing device and a blue photo-sensing device are integrated in the semiconductor substrate 110.

Figure 8:
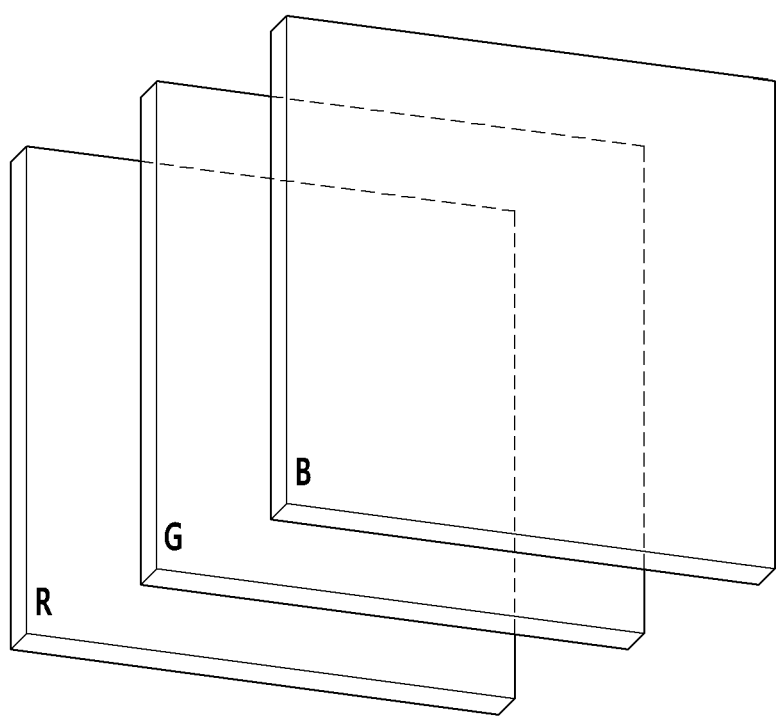
FIG. 8 is a schematic top plan view showing an organic CMOS image sensor according to some example embodiments.
Figure 9:
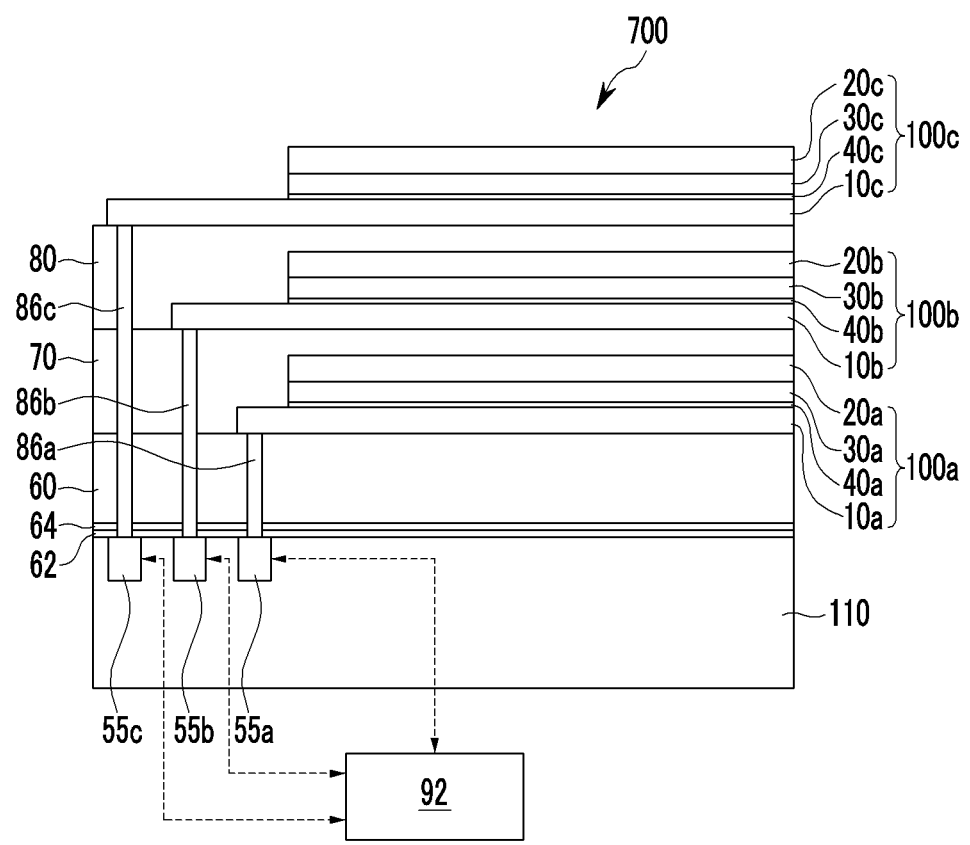
FIG. 9 is a cross-sectional view showing the organic CMOS image sensor of FIG. 8.

FIG. 8 is a schematic top plan view showing an organic CMOS image sensor according to some example embodiments and FIG. 9 is a cross-sectional view showing the organic CMOS image sensor of FIG. 8.

An organic CMOS image sensor 700 according to some example embodiments includes a green photoelectronic device configured to selectively absorb light in a green wavelength spectrum of light, a blue photoelectronic device configured to selectively absorb light in a blue wavelength spectrum of light, and a red photoelectronic device configured to selectively absorb light in a green wavelength spectrum of light, and they are stacked.

The organic CMOS image sensor 700 according to some example embodiments includes a semiconductor substrate 110, a lower insulation layer 60, an intermediate insulation layer 70, an upper insulation layer 80, a first organic photoelectronic device 100a, a second organic photoelectronic device 100b, and a third organic photoelectronic device 100c.

The semiconductor substrate 110 may be a silicon substrate, and is integrated with the transmission transistor 92 and the charge storages 55a, 55b, and 55c.

A metal wire 62 and a pad 64 are formed on the semiconductor substrate 110, and the lower insulation layer 60 is formed on the metal wire and the pad.

The first organic photoelectronic device 100a is formed on the lower insulation layer 60.

The first organic photoelectronic device 100a includes a first electrode 10a and a second electrode 20a facing each other, a photoelectronic conversion layer 30a between the first electrode 10a and the second electrode 20a, and a buffer layer 40a between the first electrode 10a and the photoelectronic conversion layer 30a. The first electrode 10a, the second electrode 20a, the photoelectronic conversion layer 30a, and the buffer layer 40a are the same as described above, and the photoelectronic conversion layer 30a may selectively absorb light in one of red, blue, and green wavelength spectra of light. In some example embodiments, the first organic photoelectronic device 100a may be a red photoelectronic device.

The first electrode 10a, the buffer layer 40a, the photoelectronic conversion layer 30a, and the second electrode 20a are sequentially stacked in the drawing, but the present disclosure is not limited thereto, and the second electrode 20a, the photoelectronic conversion layer 30a, the buffer layer 40a, and the first electrode 10a may be disposed in order.

An intermediate insulation layer 70 is formed on the first organic photoelectronic device 100a.

A second organic photoelectronic device 100b is formed on the intermediate insulation layer 70.

The second organic photoelectronic device 100b includes a first electrode 10b and a second electrode 20b facing each other, a photoelectronic conversion layer between the first electrode 10b and the second electrode 20b, and a buffer layer 40b between the first electrode 10b and the photoelectronic conversion layer 30b. The first electrode 10b, the second electrode 20b, the photoelectronic conversion layer 30b, and the buffer layer 40b are the same as described above, and the photoelectronic conversion layer 30b may selectively absorb light in one of red, blue, and green wavelength spectra of light. In some example embodiments, the second organic photoelectronic device 100b may be a blue photoelectronic device.

The first electrode 10b, the buffer layer 40b, the photoelectronic conversion layer 30b, and the second electrode 20b are sequentially stacked in the example embodiments illustrated in FIG. 8, but the present disclosure is not limited thereto, and the second electrode 20b, the photoelectronic conversion layer 30b, the buffer layer 40b, and the first electrode 10b may be disposed in order.

An intermediate insulation layer 70 is formed on the second organic photoelectronic device 100b. The lower insulation layer 60, the intermediate insulation layer 70, and the upper insulation layer 80 have a plurality of through-holes 86a, 86b, 86c exposing the charge storages 55a, 55b, and 55c, respectively.

The third organic photoelectronic device 100c is formed on the upper insulation layer 80. The third organic photoelectronic device 100c includes a first electrode 10c and a second electrode 20c facing each other, a photoelectronic conversion layer 30c between the first electrode 10c and the second electrode 20c, and a buffer layer 40c between the first electrode 10c and the photoelectronic conversion layer 30c. The first electrode 10c, the second electrode 20c, the photoelectronic conversion layer 30c, and the buffer layer 40c are the same as described above, and the photoelectronic conversion layer 30c may selectively absorb light in one of red, blue, and green wavelength spectra of light. In some example embodiments, the third organic photoelectronic device 100c may be a green photoelectronic device.

The first electrode 10c, the buffer layer 40c, the photoelectronic conversion layer 30c, and the second electrode 20c are sequentially stacked in the example embodiments illustrated in FIG. 8, but the present disclosure is not limited thereto, and the second electrode 20c, the photoelectronic conversion layer 30c, the buffer layer 40c, and the first electrode 10c may be disposed on a substrate in a sequential order.

A focusing lens (not shown) may be further formed on the organic photoelectronic device 100c. The focusing lens may control a direction of incident light and gather the light in one region. The focusing lens may have a shape of, for example, a cylinder or a hemisphere, but is not limited thereto.

In FIG. 9, the organic photoelectronic device of FIG. 1A is, for example shown as the first organic photoelectronic device 100a, the second organic photoelectronic device 100b, and the third organic photoelectronic device 100c, but organic photoelectronic devices of FIGS. 2 to 4 may be applied in the same manner.

The first organic photoelectronic device 100a, the second organic photoelectronic device 100b, and the third organic photoelectronic device 100c are sequentially stacked in the example embodiments illustrated in FIG. 9, but the present disclosure is not limited thereto, and the first organic photoelectronic device 100a, the second organic photoelectronic device 100b, and the third organic photoelectronic device 100c may be stacked in various orders.

As described above, the first organic photoelectronic device 100a, the second organic photoelectronic device 100b, and the third organic photoelectronic device 100c absorbing light in different wavelength spectra have a stacked structure and thus may further reduce the size of an image sensor and realize a down-sized image sensor.

The image sensor may be applied to, for example, various electronic devices such as a mobile phone or a digital camera, but is not limited thereto.

Hereinafter, the present disclosure is illustrated in more detail with reference to some example embodiments. However, the present disclosure is not limited thereto.

Manufacture of Organic Photoelectric Device

Example 1

A 150 nm-thick anode is formed on a glass substrate by sputtering ITO. Subsequently, on the anode, a compound represented by Chemical Formula 1B-1aa (HOMO: 5.73 eV, LUMO: 2.35 eV) is deposited to form a 5 nm-thick lower buffer layer. On the lower buffer layer, a compound represented by Chemical Formula 2A-1a is deposited to form a 5 nm-thick upper buffer layer. Subsequently, a compound represented by Chemical Formula 2A-1a as a p-type semiconductor and C60 as an n-type semiconductor are codeposited to form a 122 nm-thick photoelectronic conversion layer. Herein, the photoelectronic conversion layer includes a 42 nm-thick lower layer formed by depositing the p-type semiconductor and the n-type semiconductor in a volume ratio of 1.1:1, a 70 nm-thick middle layer formed by depositing the p-type semiconductor and the n-type semiconductor in a volume ratio of 1.9:1, and a 10 nm-thick upper layer formed by depositing the p-type semiconductor and the n-type semiconductor in a volume ratio of 1.5:1, which are sequentially formed by changing the ratio of the p-type semiconductor and the n-type semiconductor. Subsequently, on the photoelectronic conversion layer, a 7 nm-thick cathode is formed by sputtering ITO. On the cathode, a 50 nm-thick anti-reflection layer is formed by depositing aluminum oxide ($Al_2O_3$), and a glass plate is used for sealing to manufacture an organic photoelectronic device.

[Chemical Formula 1B-1aa]

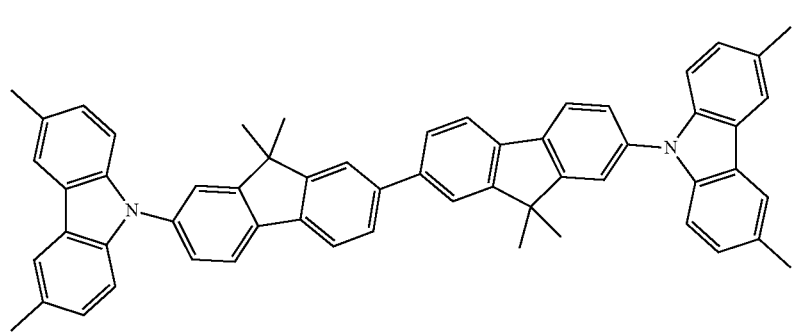

[Chemical Formula 2A-1a]

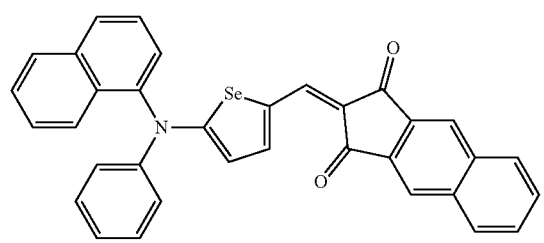

Example 2

A 150 nm-thick anode is formed on a glass substrate by sputtering ITO. Subsequently, on the anode, a compound represented by Chemical Formula 1B-1aa is deposited to form a 5 nm-thick lower buffer layer. On the lower buffer layer, a compound represented by Chemical Formula 2B-3a is deposited to form a 5 nm-thick upper buffer layer. Subsequently, a 130 nm-thick photoelectronic conversion layer is formed by codepositing a compound represented by Chemical Formula 2B-3a as a p-type semiconductor and C60 as an n-type semiconductor in a volume ratio of 1.8:1. On the photoelectronic conversion layer, a 7 nm-thick cathode is formed by sputtering ITO. Subsequently, on the cathode, a 50 nm-thick anti-reflection layer is formed by depositing aluminum oxide ($Al_2O_3$), and a glass plate is used for sealing to manufacture an organic photoelectronic device.

[Chemical Formula 2B-3a]

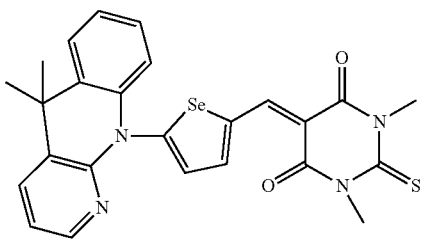

Example 3

An organic photoelectronic device is manufactured according to the same method as Example 2 except for forming a 110 nm-thick photoelectronic conversion layer.

Example 4

A 150 nm-thick anode is formed on a glass substrate by sputtering ITO. On the anode, a compound represented by Chemical Formula 1B-1aa and a compound represented by Chemical Formula 2B-3a are codeposited to form a 5 nm-thick buffer layer. Subsequently, a 110 nm-thick photoelectronic conversion layer is formed by codepositing a compound represented by Chemical Formula 2B-3a as a p-type semiconductor and C60 as an n-type semiconductor in a volume ratio of 2:1. On the photoelectronic conversion layer, a 7 nm-thick cathode is formed by sputtering ITO. Subsequently, on the cathode, a 50 nm-thick anti-reflection layer is formed by depositing aluminum oxide ($Al_2O_3$), and a glass plate is used for sealing to manufacture an organic photoelectronic device.

Example 5

An organic photoelectronic device is manufactured according to the same method as Example 4 except for codepositing a compound represented by Chemical Formula 1B-1aa and a compound represented by Chemical Formula 2B-3a to form a 10 nm-thick buffer layer.

Example 6

An organic photoelectronic device is manufactured according to the same method as Example 4 except for codepositing a compound represented by Chemical Formula 1B-1aa and a compound represented by Chemical Formula 2B-3a to form a 20 nm-thick buffer layer.

Comparative Example 1

An organic photoelectronic device is manufactured according to the same method as Example 1 except for forming no upper buffer layer.

Comparative Example 2

An organic photoelectronic device is manufactured according to the same method as Example 2 except for forming no buffer layer.

Comparative Example 3

An organic photoelectronic device is manufactured according to the same method as Example 3 except for forming no buffer layer.

Comparative Example 4

An organic photoelectronic device is manufactured according to the same method as Example 4 except for depositing a compound represented by Chemical Formula 1B-1aa alone to form a 5 nm-thick buffer layer instead of codepositing a compound represented by Chemical Formula 1B-1aa and a compound represented by Chemical Formula 2B-3a.

Evaluation

Evaluation 1

Photoelectric conversion efficiency (EQE), a leakage current, and a driving voltage of the organic photoelectronic devices according to Example 1 and Comparative Example 1 are evaluated.

The photoelectric conversion efficiency (EQE) is evaluated in a method of Incident Photon to Current Efficiency (IPCE) in a wavelength spectrum of light of 400 nm to 720 nm ($\lambda_{max}$=570 nm). The leakage current is evaluated as dark current density and detectivity after heat-treating the organic photoelectronic devices at 140° C. for 1 hour, and herein, the dark current density is measured from a current flowing when a ~3V reverse bias is applied to them, and the detectivity is expressed as a light dose when a signal is 10 times as much as a noise. The driving voltage is evaluated as a voltage at 70% of the photoelectric conversion efficiency (EQE).

The results are provided in Table 1.

TABLE 1

|  | $EQE_{570\ nm}$ (%) | Dark current density (h/s/μm$^2$) (before/after heat treatment) | Driving voltage (V) |
| --- | --- | --- | --- |
| Example 1 | 67.6 | 42/5 | 3.4 |
| Comparative Example 1 | 64.4 | 133/9 | 4.5 |

Referring to Table 1, the organic photoelectronic device according to Example 1 shows all improved external quantum efficiency (EQE), dark current density, and driving voltage compared with the organic photoelectronic device according to Comparative Example 1.

Evaluation 2

Photoelectric conversion efficiency (EQE), leakage current, and driving voltage of the organic photoelectronic devices according to Examples 2 and 3 and Comparative Examples 2 and 3 are evaluated.

The results are provided in Tables 2 and 3.

TABLE 2

|  | $EQE_{535\ nm}$ (%) | Dark current density (h/s/μm$^2$) (before heat treatment/ after heat treatment) | Driving voltage (V) |
| --- | --- | --- | --- |
| Example 2 | 72.1 | 138/11 | 2.5 |
| Comparative Example 2 | 70.6 | 229/14 | 3.0 |

TABLE 3

|  | $EQE_{535\ nm}$ (%) | Dark current density (h/s/μm$^2$) (after heat treatment) | Driving voltage (V) |
| --- | --- | --- | --- |
| Example 3 | 68.0 | 15 | 4 V |
| Comparative Example 3 | 66.8 | 21 | 5 V |

Referring to Table 2, the organic photoelectronic device according to Example 2 shows all improved external quantum efficiency (EQE), dark current density, and driving voltage compared with the organic photoelectronic device according to Comparative Example 2.

Likewise, referring to Table 3, the organic photoelectronic device according to Example 3 shows all improved external quantum efficiency (EQE), dark current density, and driving voltage compared with the organic photoelectronic device according to Comparative Example 3.

Evaluation 3

Photoelectric conversion efficiency (EQE), leakage current, and driving voltage of the organic photoelectronic devices according to Examples 4 to 6 and Comparative Example 4 are evaluated.

The results are provided in Table 4.

TABLE 4

|  | EQE (%) | Dark current density (h/s/μm$^2$) (after heat treatment) | Driving voltage (V) | $\lambda_{max}$ (nm) |
| --- | --- | --- | --- | --- |
| Example 4 | 65.7 | 2 | 5 | 535 |
| Example 5 | 64.7 | 1 | 7 | 545 |
| Example 6 | 65.6 | 21 | 6 | 545 |
| Comparative Example 4 | 61.2 | 21 | 10 | 540 |

Referring to Table 4, the organic photoelectronic devices according to Examples 4 to 6 show all improved external quantum efficiency (EQE), dark current density, and driving voltage compared with the organic photoelectronic device according to Comparative Example 4.

Figure 10:
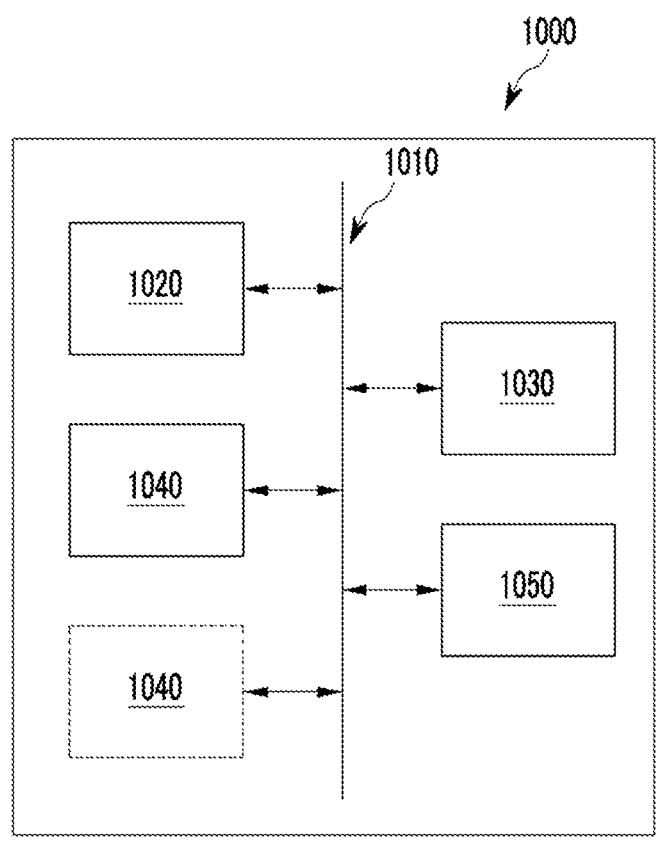
FIG. 10 is a diagram illustrating an electronic device according to some example embodiments.

FIG. 10 is a diagram illustrating an electronic device 1000 according to some example embodiments.

Referring to FIG. 10, the electronic device 1000 includes a memory 1020, a processor 1030, a device 1040, and a communication interface 1050. The device 1040 may include any of the organic photoelectronic devices illustrated and described herein, including the example embodiments of organic photoelectronic device 100 shown in FIGS. 1A-B, the example embodiments of organic photoelectronic device 200 shown in FIG. 2, the example embodiments of organic photoelectronic device 300 shown in FIG. 3, and the example embodiments of organic photoelectronic device 400 shown in FIG. 4. The device 1040 may include any of the organic CMOS image sensors illustrated and described herein, including any of the example embodiments of organic CMOS image sensor 500 shown in FIGS. 5-6, organic CMOS image sensor 600 shown in FIG. 7, and the organic CMOS image sensor 700 shown in FIGS. 8-9.

The electronic device 1000 may be included in one or more various electronic devices, including, for example, a mobile phone, a digital camera, a sensor device, a biosensor device, and the like. In some example embodiments, the electronic device 1000 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 1020, the processor 1030, the device 1040, and the communication interface 1050 may communicate with one another through a bus 1010.

The communication interface 1050 may communicate data from an external device using various Internet protocols. For example, the communication interface 1050 may communicate sensor data generated by the device 1040 to an external device. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 1030 may execute a program and control the electronic device 1000. A program code to be executed by the processor 1030 may be stored in the memory 1020. An electronic system may be connected to an external device through an input/output device (not shown) and exchange data with the external device.

The memory 1020 may store information output from the device 1040, including information transmitted from the transistor 92. The memory 1020 may be a volatile or a nonvolatile memory. The memory 1020 may be a non-transitory computer readable storage medium. The memory may store computer-readable instructions that, when executed, cause the execution of one or more methods, functions, processes, etc. as described herein. In some example embodiments, the processor 1030 may execute one or more of the computer-readable instructions stored at the memory 1020.

In some example embodiments, the electronic device 1000 may include a display panel 1060 that may output an image generated based at least in part upon information output from the device 1040.

In some example embodiments, element 1060 may be absent from the electronic device 1000. In some example embodiments, the communication interface 1050 may include a USB and/or HDMI interface. In some example embodiments, the communication interface 1050 may include a wireless communication interface.

Figure 11:
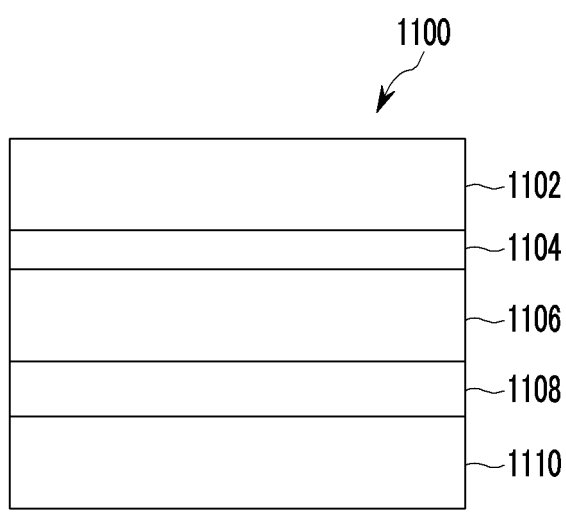
FIG. 11 is a cross-sectional view showing a solar cell according to some example embodiments.

FIG. 11 is a cross-sectional view showing a solar cell 1100 according to some example embodiments. Referring to FIG. 11, a solar cell 1100 includes a first electrode 1102 and a second electrode 1110, and a photoactive layer 1106 positioned between the first electrode 1102 and the second electrode 1110.

A substrate (not shown) may be positioned at the first electrode 1102 or the second electrode 1110, and may include a light-transmitting material. The light-transmitting material may include, for example, an inorganic material (e.g., glass), or an organic material (e.g., polycarbonate, polymethylmethacrylate, polyethylene terephthalate, polyethylene naphthalate, polyamide, polyethersulfone, or a combination thereof).

One of the first electrode 1102 and the second electrode 1110 is an anode and the other is a cathode. At least one of the first electrode 1102 and second electrode 1110 may be a light-transmitting electrode, and light may enter toward the light-transmitting electrode. The light-transmitting electrode may be made of, for example, a conductive oxide (e.g., indium tin oxide (ITO)), indium doped zinc oxide (IZO), tin oxide ($SnO_2$), aluminum-doped zinc oxide (AZO), and/or gallium-doped zinc oxide (GZO), or a transparent conductor of a conductive carbon composite (e.g., carbon nanotubes (CNT) or graphenes). At least one of the first electrode 1102 and the second electrode 1110 may be an opaque electrode, which may be made of an opaque conductor, for example, aluminum (Al), silver (Ag), gold (Au), and/or lithium (Li).

The solar cell 1100 may include an organic photoelectronic device according to some example embodiments.

First and second auxiliary layers 1104 and 1108 may be positioned between the first electrode 1102 and the photoactive layer 1106 and between the second electrode 1110 and the photoactive layer 1106, respectively. The first and second auxiliary layers 1104 and 1108 may increase charge mobility between the first electrode 1102 and the photoactive layer 1106 and between the second electrode 1110 and the photoactive layer 1106. The first and second auxiliary layers 1104 and 1106 may be at least one selected from, for example, an electron injection layer (EIL), an electron transport layer, a hole injection layer (HIL), a hole transport layer, and a hole blocking layer, but are not limited thereto. One or both of the first and second auxiliary layers 1104 and 1108 may be omitted.

The photoactive layer 1106 may have a tandem structure where at least two thereof are stacked.

Figure 12:
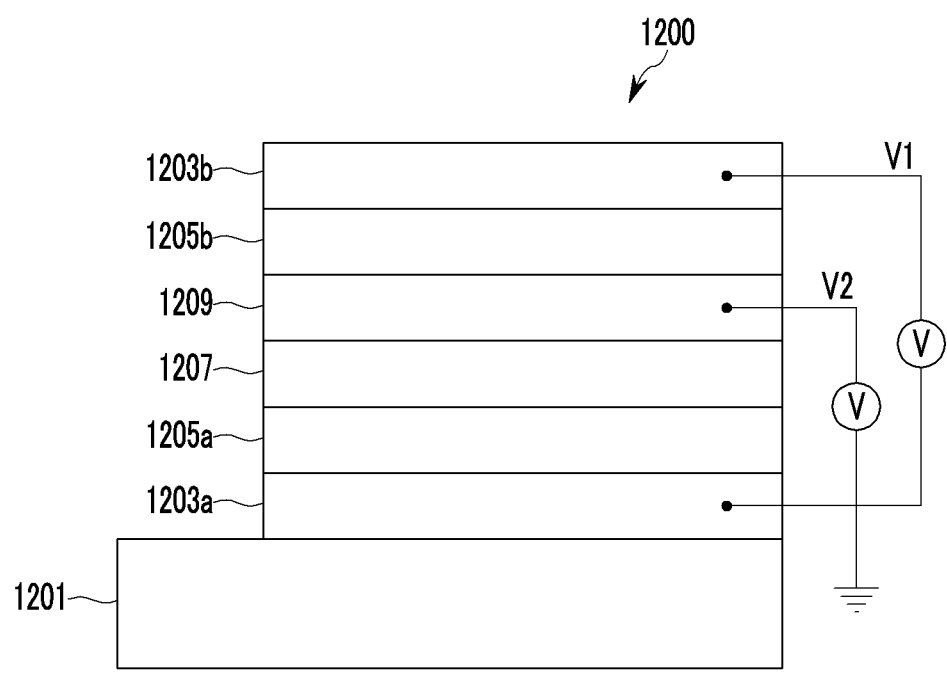
FIG. 12 is a sectional view of an organic light-emitting display apparatus according to some example embodiments.

FIG. 12 is a sectional view of an organic light-emitting display apparatus 1200 according to some example embodiments.

Referring to FIG. 12, a first electrode 1203*a* and a second electrode 1203*b* are positioned on a substrate 1201, a first emission layer 1205*a* is positioned on the first electrode 1203*a*, and a second emission layer 1205*b* is positioned under the second electrode 1203*b*.

The substrate 1201 may include a material selected from the group consisting of glass, quartz, silicon, a synthetic resin, a metal, and a combination thereof. The synthetic resin may include polyethylene naphthalate (PEN), polyethylene terephthalate (PET), polycarbonate, polyvinyl alcohol, polyacrylate, polyimide, polynorbornene and/or polyethersulfone (PES), etc. The metal plate may include a stainless steel foil and/or an aluminum foil, etc.

The first electrode 1203*a* may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof, etc. In addition, these metals may be laminated to provide a first electrode. The first electrode 1203*a* may have a thickness of about 120 to about 120 nm.

The second electrode 1203*b* may include a material having a work function of about 12.3 eV to about 12.7 eV or about 12.5 eV to about 12.7 eV. According to some example embodiments, the second electrode 1203*b* may include Ba:Al. The second electrode 1203*b* may have a thickness of about 120 to about 120 nm.

The organic light-emitting display apparatus 1200 may include an organic photoelectronic device according to some example embodiments.

A middle electrode 1209 is positioned between the first emission layer 1205*a* and the second emission layer 1205*b*. The middle electrode 1209 may include a material having a work function of about 5.0 eV to about 5.2 eV. According to some example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof.

A buffer layer 1207 may be positioned between the first emission layer 1205*a* and the middle electrode 1209, and may include a material selected from the group consisting of a metal oxide, a polyelectrolyte, and combinations thereof. The combination thereof refers to the metal oxide and polyelectrolyte being mixed or laminated to provide a multilayer. In addition, the different kinds of metal oxide or polyelectrolyte may be laminated.

Figure 13:
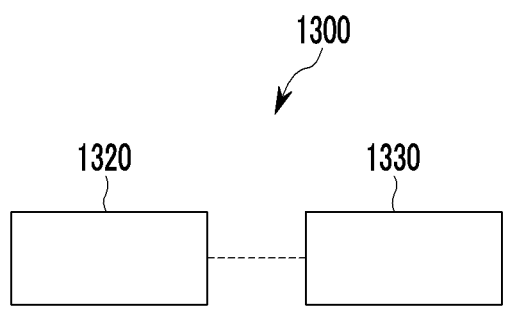
FIG. 13 is a view showing a sensor according to some example embodiments.

FIG. 13 is a view showing a sensor 1300 according to some example embodiments.

Referring to FIG. 13, a sensor 1300 (for example a gas sensor, light sensor, energy sensor, but example embodiments are not limited thereto) includes at least one electrode 1320 configured to output a signal to a processor 1330. The processor 1330 may include a microprocessor, but example embodiments are not limited thereto. The sensor 1300 may include an organic photoelectronic device according to some example embodiments.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An organic photoelectronic device, comprising:
a photoelectronic conversion layer including a p-n junction, the p-n junction including a first light absorbing material and a second light absorbing material, the first light absorbing material including an organic material; and
a buffer layer adjacent to the photoelectronic conversion layer, the buffer layer including the first light absorbing material and a non-absorbing organic material associated with a visible wavelength spectrum of light, the non-absorbing organic material having an energy bandgap of greater than or equal to about 2.8 eV.

2. The organic photoelectronic device of claim 1, wherein the buffer layer includes, a first buffer layer distal from the photoelectronic conversion layer, the first buffer layer including the non-absorbing organic material associated with the visible wavelength spectrum of light, and
a second buffer layer proximate to the photoelectronic conversion layer, the second buffer layer including the first light absorbing material.

3. The organic photoelectronic device of claim 1, wherein the buffer layer includes a mixture of the first light absorbing material and the non-absorbing organic material associated with the visible wavelength spectrum of light.

4. The organic photoelectronic device of claim 1, wherein the buffer layer includes, a first buffer layer distal from the photoelectronic conversion layer, the first buffer layer including the non-absorbing organic material associated with the visible wavelength spectrum of light, and
a second buffer layer proximate to the photoelectronic conversion layer, the second buffer layer including a mixture of the first light absorbing material and the non-absorbing organic material associated with the visible wavelength spectrum of light.

5. The organic photoelectronic device of claim 1, wherein the buffer layer includes, a first buffer layer distal from the photoelectronic conversion layer, the first buffer layer including the non-absorbing organic material associated with the visible wavelength spectrum of light,
a second buffer layer proximate to the photoelectronic conversion layer, the second buffer layer including the first light absorbing material, and
a third buffer layer between the first buffer layer and the second buffer layer, the third buffer layer including a mixture of the first light absorbing material and the non-absorbing organic material associated with the visible wavelength spectrum of light.

6. The organic photoelectronic device of claim 1, wherein the non-absorbing organic material associated with the visible wavelength spectrum of light is a compound represented by Chemical Formula 1A or 1B,

[Chemical Formula 1A]

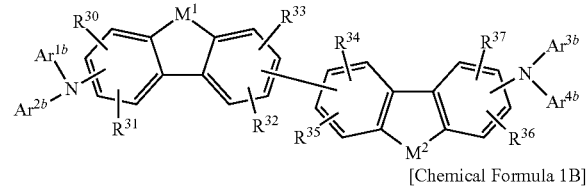

[Chemical Formula 1B]

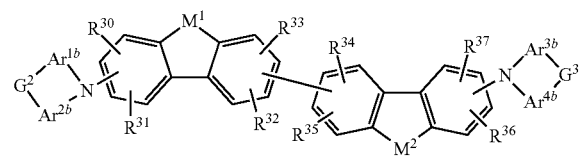

wherein, in Chemical Formula 1A or 1B,
each of $M^1$ and $M^2$ are independently $CR''R^o$, $SiR^pR^q$, $NR^r$, O, S, Se, or Te,
each of $Ar^{1b}$, $Ar^{2b}$, $Ar^{3b}$, and $Ar^{4b}$ are independently a substituted or unsubstituted $C_6$ to $C_{30}$ aryl group or a substituted or unsubstituted $C_3$ to $C_{30}$ heteroaryl group,
each of $G^2$ and $G^3$ are independently a single bond, —$(CR^sR^t)_{n3}$—, —O—, —S—, —Se—, —N=, —NR^u—, —SiR^vR^w— or —GeR^xR^y—, wherein n3 is 1 or 2, and each of $R^{30}$ to $R^{37}$ and $R''$ to $R^y$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heterocyclic group, a substituted or unsubstituted $C_1$ to $C_6$ alkoxy group, a halogen, or a cyano group.

7. The organic photoelectronic device of claim 1, wherein the photoelectronic conversion layer and the buffer layer are in contact with each other.

8. The organic photoelectronic device of claim 1, wherein the buffer layer has a thickness of about 2 nm to about 40 nm.

9. An electronic device including the organic photoelectronic device of claim 1.

* * * * *